(12) United States Patent
Ohnuma

(10) Patent No.: US 8,198,146 B2
(45) Date of Patent: Jun. 12, 2012

(54) SEMICONDUCTOR DEVICE AND MANUFACTURING METHOD THEREOF

(75) Inventor: Hideto Ohnuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 156 days.

(21) Appl. No.: 12/731,699

(22) Filed: Mar. 25, 2010

(65) Prior Publication Data

US 2010/0244051 A1    Sep. 30, 2010

(30) Foreign Application Priority Data

Mar. 27, 2009    (JP) .................................. 2009-078577

(51) Int. Cl.
    *H01L 21/302* (2006.01)
(52) U.S. Cl. ................... 438/149; 257/59; 257/E27.062
(58) Field of Classification Search .......... 438/48, 438/149, 159, 166, 479, 485; 257/59, 72, 257/77, 359, E27.11, E27.062
    See application file for complete search history.

(56) References Cited

U.S. PATENT DOCUMENTS

| | | | |
|---|---|---|---|
| 6,818,529 B2 | 11/2004 | Bachrach et al. | |
| 7,081,704 B2 * | 7/2006 | Yamazaki et al. | 313/500 |
| 7,148,542 B2 * | 12/2006 | Yamazaki et al. | 257/347 |
| 7,291,523 B2 * | 11/2007 | Yamazaki et al. | 438/166 |
| 7,329,923 B2 | 2/2008 | Doris et al. | |
| 7,446,026 B2 * | 11/2008 | Zhang et al. | 438/592 |
| 7,605,401 B2 * | 10/2009 | Yamazaki et al. | 257/72 |
| 7,713,807 B2 | 5/2010 | Doris et al. | |
| 7,781,766 B2 * | 8/2010 | Shih et al. | 257/59 |
| 7,935,589 B2 * | 5/2011 | Teo et al. | 438/197 |
| 2003/0164522 A1 * | 9/2003 | Kato et al. | 257/359 |
| 2008/0116795 A1 * | 5/2008 | Tsuchiya et al. | 313/512 |
| 2008/0242050 A1 | 10/2008 | Yamazaki et al. | |
| 2008/0265280 A1 * | 10/2008 | Currie | 257/190 |
| 2009/0072243 A1 | 3/2009 | Suda et al. | |
| 2009/0230503 A1 * | 9/2009 | Shimomura et al. | 257/506 |
| 2010/0148261 A1 * | 6/2010 | Fukushima et al. | 257/349 |

FOREIGN PATENT DOCUMENTS

| | | |
|---|---|---|
| JP | 2003-229570 A | 8/2003 |
| JP | 2003-282845 A | 10/2003 |
| JP | 2007-027646 A | 2/2007 |
| JP | 2007-123675 A | 5/2007 |

* cited by examiner

*Primary Examiner* — Nathan Ha

(74) *Attorney, Agent, or Firm* — Fish & Richardson P.C.

(57) ABSTRACT

An object is to realize an integrated circuit included in a semiconductor device which has multiple functions, or to increase the size of an integrated circuit even when the integrated circuit is formed using a silicon carbide substrate. The integrated circuit includes a first transistor including an island-shaped silicon carbide layer provided over a substrate with a first insulating layer interposed therebetween, a first gate insulating layer provided over the silicon carbide layer, and a first conductive layer provided over the first gate insulating layer and overlapped with the silicon carbide layer; and a second transistor including an island-shaped single crystal silicon layer provided over the substrate with a second insulating layer interposed therebetween, a second gate insulating layer provided over the single crystal silicon layer, and a second conductive layer provided over the second gate insulating layer and overlapped with the single crystal silicon layer.

10 Claims, 13 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof and particularly relates to a semiconductor device which controls a relatively large amount of electric power.

2. Description of the Related Art

In recent years, various kinds of products including integrated circuits have been produced in a variety of field, and increase in size and functionality of integrated circuits has increasingly progressed. While a circuit (a control circuit) for which high speed operation and/or low voltage operation is required is necessary for an integrated circuit included in a semiconductor device, a circuit (a power circuit) for which a sufficient reliability (high withstand voltage) is required at the time of high voltage application.

In general, elements included in an integrated circuit are formed using a silicon substrate. However, in recent years, an element which is formed using a semiconductor substrate which has a larger band gap than silicon has been attracting attention so that an element having higher efficiency for a power circuit is manufactured. For example, when silicon carbide (SiC) is used for an element for power source, the element formed using SiC has a dielectric strength voltage approximately ten times higher than an element formed using silicon and power loss can be drastically reduced when the element formed using SiC is used as an electric power converter such as an inverter or a converter; therefore, the element formed using SiC is expected to be put into practical use (for example, Patent Document 1).

For realizing practical use of a device formed using silicon carbide, defects of a silicon carbide substrate should be reduced. In general, a silicon carbide substrate formed using a sublimation recrystallization method tends to have hollow-core defects called micropipes and there is a problem in that even one micropipe in a transistor prevents the transistor from functioning. The size of a single crystal silicon substrate which is put into practical use is 12 inch. On the other hand, the size of a silicon carbide substrate is still 3 inch generally. Accordingly, when an integrated circuit which includes an element such as transistor formed using a silicon carbide substrate is manufactured, it is difficult to increase the size of the integrated circuit.

Further, there is a general tendency to create a trade-off between elements required for circuits (a control circuit, a power circuit, or the like) included in the integrated circuit; therefore, it is difficult for an integrated circuit with one semiconductor substrate to have multiple functions.

Reference

[Patent Document 1] Japanese Published Patent Application No. 2003-229570

SUMMARY OF THE INVENTION

An object of one embodiment of the present invention is to realize an integrated circuit having multiple functions, which is formed over the same substrate. Another object of one embodiment of the present invention is to increase the size of an integrated circuit even when the integrated circuit is formed using a silicon carbide substrate.

One embodiment of the present invention is to provide, over the same substrate, an element including a silicon carbide layer with a first insulating layer interposed therebetween and an element including a silicon layer with a second insulating layer interposed therebetween to realize a circuit having multiple functions.

Another embodiment of the present invention is a semiconductor device including a first transistor which includes an island-shaped silicon carbide layer provided over a substrate with a first insulating layer interposed therebetween, a first gate insulating layer provided over the silicon carbide layer, and a first conductive layer provided over the first gate insulating layer and overlapped with the silicon carbide layer; and a second transistor which includes an island-shaped single crystal silicon layer provided over the substrate with a second insulating layer interposed therebetween, a second gate insulating layer provided over the single crystal silicon layer, and a second conductive layer provided over the second gate insulating layer and overlapped with the single crystal silicon layer, in which the first transistor and the second transistor are electrically connected to each other.

In this case, since the silicon carbide layer included in the first transistor and the silicon layer included in the second transistor have different band gaps, dielectric breakdown electric fields, and mobility when used in a device, circuits which have different characteristics can be manufactured using the first transistor and the second transistor.

Further, when the first transistor and the second transistor are each applied to a circuit having characteristics, the first gate insulating layer is preferably thicker than the second gate insulating layer. Furthermore, the silicon carbide layer can be provided to be thicker than the single crystal silicon layer.

In this case, the first transistor can function as a power circuit which requires high withstand voltage, and the second transistor can function as a control circuit which operates at high speed and/or at low voltage.

Another embodiment of the present invention is a semiconductor device including a diode which includes a first electrode layer provided over a substrate with a first insulating layer interposed therebetween, an island-shaped silicon carbide layer provided over the first electrode layer, and a second electrode layer provided over the silicon carbide layer; and a transistor which includes a single crystal silicon layer provided over the substrate with a second insulating layer interposed therebetween, a gate insulating layer provided over the single crystal silicon layer, and a conductive layer provided over the gate insulating layer and overlapped with the single crystal silicon layer.

Another embodiment of the present invention is a semiconductor device including a diode which includes an island-shaped silicon carbide layer provided over a substrate with a first insulating layer interposed therebetween, a p-type impurity region and an n-type impurity region provided in the silicon carbide layer, a first electrode layer which is electrically connected to the p-type impurity region, and a second electrode layer which is electrically connected to the n-type impurity region; and a transistor which includes a single crystal silicon layer provided over the substrate with a second insulating layer interposed therebetween, a gate insulating layer provided over the single crystal silicon layer, and a conductive layer provided over the gate insulating layer and overlapped with the single crystal silicon layer.

Another embodiment of the present invention is a method for manufacturing a semiconductor device, including the steps of forming a first brittle region in a silicon carbide substrate by first ion irradiation of the silicon carbide substrate; forming a second brittle region in a single crystal silicon substrate by second ion irradiation of the single crystal silicon substrate; bonding the silicon carbide substrate and a base substrate to each other with a first insulating layer interposed therebetween; bonding the single crystal silicon substrate and the base substrate to each other with a second insulating layer interposed therebetween; separating the silicon carbide substrate in the first brittle region to form a silicon carbide layer over the base substrate with the first insulating layer interposed therebetween; separating the single crystal silicon substrate in the second brittle region to form a single crystal silicon layer over the base substrate with the second insulating layer interposed therebetween; and forming a first transistor including the silicon carbide layer as a channel layer and a second transistor including the single crystal silicon layer as a channel layer.

Another embodiment of the present invention is a method for manufacturing a semiconductor device, including the steps of forming a conductive layer over a silicon carbide substrate; forming a first brittle region in the silicon carbide substrate by irradiation of the silicon carbide substrate with a first ion; forming a second brittle region in a single crystal silicon substrate by irradiation of the single crystal silicon substrate with a second ion; bonding the silicon carbide substrate and a base substrate to each other with the conductive layer and a first insulating layer interposed therebetween; bonding the single crystal silicon substrate and the base substrate to each other with a second insulating layer interposed therebetween; separating the silicon carbide substrate in the first brittle region to form a silicon carbide layer over the base substrate with the conductive layer and the first insulating layer interposed therebetween; separating the single crystal silicon substrate in the second brittle region to form a single crystal silicon layer over the base substrate with the second insulating layer interposed therebetween; and forming a diode including the silicon carbide layer and a transistor including the single crystal silicon layer as a channel layer.

In addition, transistors described in this specification can have various structures without limitation to a particular structure. For example, a multi-gate structure having two or more gate electrodes may be used. When the multi-gate structure is used, a structure where a plurality of transistors is connected in series is provided because channel regions are connected in series. With the multi-gate structure, reduction in off current and increase in withstand voltage of the transistor (improvement in reliability) can be achieved. Further, by employing the multi-gate structure, drain-source current does not change much even when drain-source voltage changes when the transistor operates in a saturation region; thus, the slope of voltage-current characteristics can be flat. By utilizing the flat slope of the voltage-current characteristics, an ideal current source circuit or an active load having an extremely high resistance value can be provided. Accordingly, a differential circuit or a current mirror circuit which has excellent properties can be provided.

As another example, a structure where gate electrodes are formed above and below a channel may be employed. By employing the structure where gate electrodes are formed above and below the channel, a channel region is enlarged; thus, a current value can be increased. In addition, by employing the structure where gate electrodes are formed above and below the channel, a depletion layer is easily formed; thus, a subthreshold swing can be improved. When the gate electrodes are formed above and below the channel, a structure where a plurality of transistors is connected in parallel is provided.

Alternatively, a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel, or a structure where channel regions are connected in series can be used. Further alternatively, a structure where a source electrode or a drain electrode overlaps with a channel region (or part of it) can be used. With the use of the structure where the source electrode or the drain electrode overlaps with the channel region (or part of it), unstable operation due to electric charge accumulated in part of the channel region can be prevented. Still alternatively, a structure where an LDD region is provided can be used. By providing the LDD region, reduction in off current and increase in withstand voltage of the transistor (improvement in reliability) can be achieved. Further, by providing the LDD region, drain-source current does not change much even when drain-source voltage changes when the transistor operates in the saturation region; thus, the slope of voltage-current characteristics can be flat.

In this specification, silicon oxynitride contains oxygen and nitrogen so that the amount of oxygen is larger than that of nitrogen and, in the case where measurements are conducted using Rutherford backscattering spectrometry (RBS) and hydrogen forward scattering (HFS), preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains nitrogen and oxygen so that the amount of nitrogen is larger than that of oxygen and, in the case where measurements are conducted using RBS and HFS, preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Note that in this specification, a semiconductor device refers to any device which can function by utilizing semiconductor characteristics; a display device, a semiconductor circuit, and an electronic appliance are all included in the category of the semiconductor device.

According to one embodiment of the present invention, a circuit including an element having high withstand voltage and a circuit including an element which operates at high speed and/or at low voltage are formed using a silicon carbide layer and a silicon layer which are formed over the same substrate; accordingly, an integrated circuit can have multiple functions.

Further, according to one embodiment of the present invention, a silicon carbide substrate and a silicon substrate are bonded to the same substrate and both separated with part of them left on the substrate, whereby a silicon carbide layer and a silicon layer can be formed over the same substrate. Therefore, even when a silicon carbide substrate is used, increase in size of an integrated circuit can be achieved without limitation of the size of the silicon carbide substrate.

DETAILED DESCRIPTION OF THE INVENTION

Figure 1A:
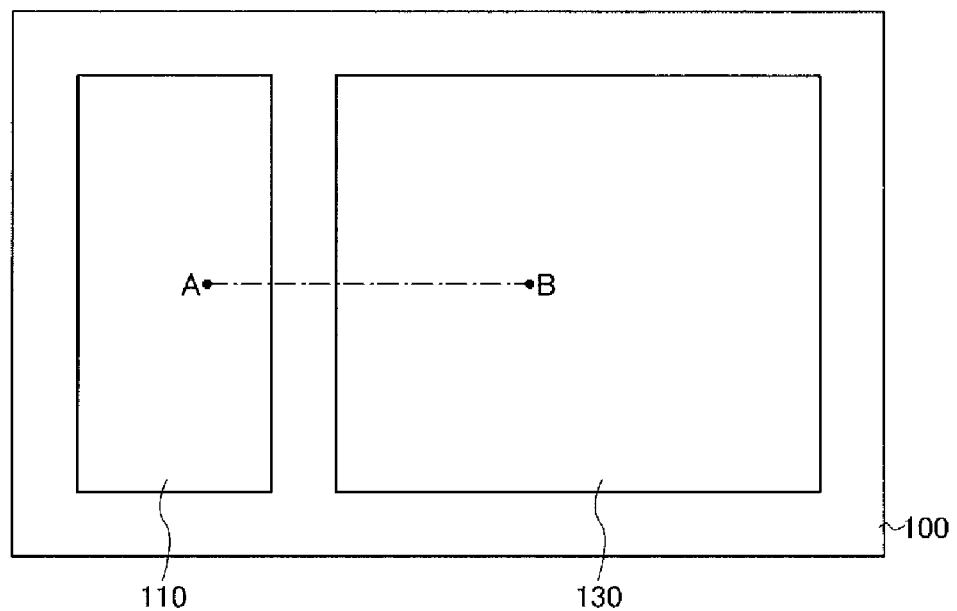
FIGS. 1A and 1B illustrate an example of a structure of a semiconductor device.

Embodiments of the present invention will be described below in detail with reference to the accompanying drawings. The present invention is not limited to the following description of the embodiments and it is easily understood by those skilled in the art that modes and details of the present invention can be changed in various ways without departing from the spirit and scope of the present invention. Therefore, the present invention should not be interpreted as being limited to the description of the embodiment below. Further, structures according to different embodiments can be carried out in combination as appropriate. In the structures of the invention described below, the same portions or portions having similar functions are denoted by the same reference numerals, and repetitive description thereof is omitted.

(Embodiment 1)

In this embodiment, an example of a structure of a semiconductor device is described with reference to drawings.

Figure 1B:
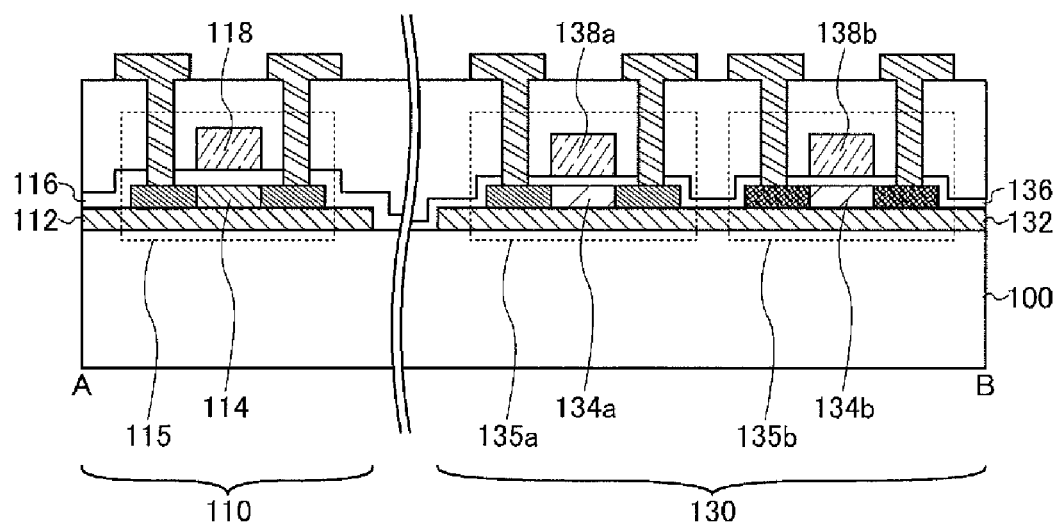

First, a semiconductor device of this embodiment is described with reference to FIGS. 1A and 1B. FIG. 1A is a plane view of a semiconductor device and FIG. 1B is a schematic cross-sectional view taken along line A-B in FIG. 1A.

The semiconductor device described in this embodiment can include a first circuit group 110 including an element having high withstand voltage and a second circuit group 130 including an element which operates at high speed and/or at low voltage over a substrate 100 (see FIG. 1A). Note that this embodiment describes a structure in which the semiconductor device includes an integrated circuit having the first circuit group 110 and the second circuit group 130; however, the structure is not limited thereto and other circuit groups may be included in the integrated circuit.

The first circuit group 110 can be formed using an element including a semiconductor (for example, a silicon carbide layer) having a band gap larger than that of silicon. In FIGS. 1A and 1B, an example in which a transistor 115 in which a silicon carbide layer 114 functions as a channel layer is provided with the first circuit group 110 is illustrated. In this case, the transistor 115 in the semiconductor device can function as a power circuit which requires high withstand voltage.

The structure of the transistor 115 is not limited to a particular structure as long as it has the silicon carbide layer 114 as a channel layer. As an example, the transistor 115 may include an island-shaped silicon carbide layer 114 formed over the substrate 100 with an insulating layer 112 interposed therebetween, an insulating layer 116 formed over the silicon carbide layer 114, a conductive layer 118 formed over the insulating layer 116 and overlapped with the silicon carbide layer 114 (see FIG. 1B). In this case, in the transistor 115, the insulating layer 116 functions as a gate insulating layer and the conductive layer 118 functions as a gate electrode.

The second circuit group 130 can be formed using an element including silicon. In FIGS. 1A and 1B, an example in which a transistor 135a which includes a silicon layer 134a as a channel layer and a transistor 135b which includes a silicon layer 134b as a channel layer are provided in the second circuit group 130 is described. In this case, the transistor 135a and the transistor 135b in the semiconductor device can function as a control circuit which operates at high speed and/or at low voltage.

A structure of each of the transistors 135a and 135b is not limited to a particular structure as long as the transistor 135a includes the silicon layer 134a and the transistor 135b includes the silicon layer 134b. As an example, the transistor 135a can include the island-shaped silicon layer 134a provided over the substrate 100 with an insulating layer 132 interposed therebetween, an insulating layer 136 provided over the silicon layer 134a, and a conductive layer 138a provided over the insulating layer 136. Further, the transistor 135b can include the island-shaped silicon layer 134b provided over the substrate 100 with the insulating layer 132 interposed therebetween, the insulating layer 136 provided over the silicon layer 134b, and a conductive layer 138b provided over the insulating layer 136 (see FIG. 1B). In this case, in the transistors 135a and 135b, the insulating layer 136 functions as a gate insulating layer and the conductive layers 138a and 138b function as gate electrodes.

Note that transistors 115 and 135a are n-channel transistors and the transistor 135b is a p-channel transistor in FIGS. 1A and 1B; however, the structure is not limited thereto. The transistor 115 may be a p-channel transistor, and the first circuit group 110 may include an n-channel transistor and a p-channel transistor. Further, both the transistors 135a and 135b may be n-channel transistors or p-channel transistors. Note that an n-channel transistor means that the transistor has an n-channel in an operation state, and a p-channel transistor means that the transistor has a p-channel in an operation state.

In FIGS. 1A and 1B, an element (here, the transistor 115) in the first circuit group 110 and elements (here, the transistor 135a and the transistor 135b) in the second circuit group 130, which are provided over the same substrate (here, the substrate 100), can be electrically connected to each other. Electrical connection can be performed using a source wiring or a drain wiring of the transistors.

As illustrated in FIG. 1B, the insulating layer 136 can be thinner than the insulating layer 116. In this case, withstand voltage of the transistor 115 provided in the first circuit group 110 can be improved and the transistors 135a and 135b provided in the second circuit group 130 can operate at high speed and/or at low voltage; thus, high efficiency of an integrated circuit can be achieved.

Needless to say, in the case where withstand voltage of the transistor 115 can be improved using the silicon carbide layer 114, the insulating layer 136 and the insulating layer 116 may be formed using the same material and having the same or substantially the same thickness. In this case, the insulating layer 116 and the insulating layer 136 can be formed at the same time; therefore, simplification of the manufacturing process and cost reduction can be achieved.

As illustrated in FIGS. 1A and 1B, over the substrate 100, a transistor (here, the transistor 115) in which a silicon carbide layer serves as a channel layer and transistors (here, the transistors 135a and 135b) each in which a silicon layer serves as a channel layer are provided, whereby an integrated circuit can have multiple functions.

Moreover, a power circuit including an element having a silicon carbide layer and a control circuit including an element having a silicon layer are provided over the same substrate 100, whereby the size of a semiconductor device can be reduced as compared to the case where a control circuit and a power circuit are manufactured over separate semiconductor substrates and electrically connected to each other.

Figure 2A:
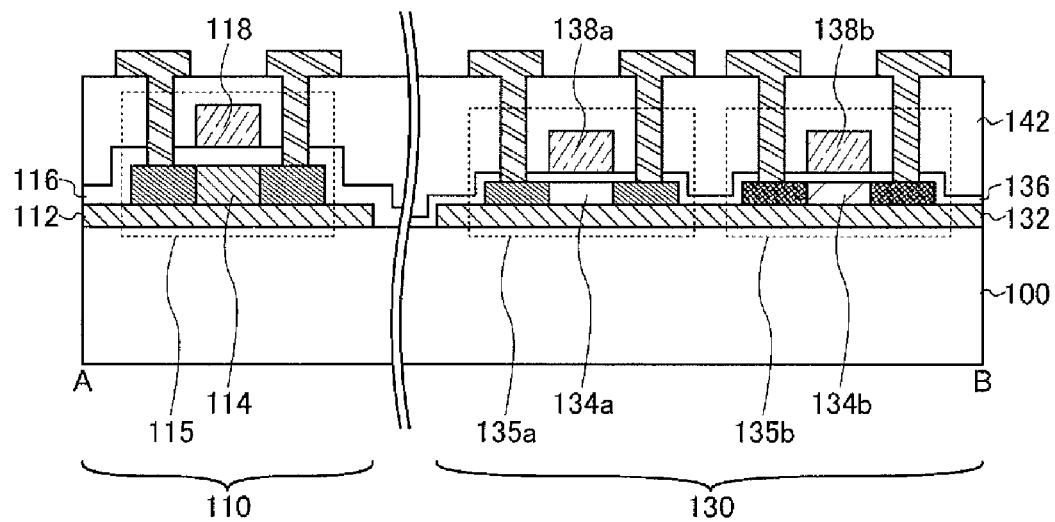
FIGS. 2A and 2B each illustrate an example of a structure of a semiconductor device.

Further, in the structure illustrated in FIGS. 1A and 1B, in terms of high withstand voltage, it is preferable that a channel layer (here, the silicon carbide layer 114) of the transistor 115 in the first circuit group 110 be thicker than the silicon layers 134a and 134b of the transistors 135a and 135b in the second circuit group 130 (see FIG. 2A).

Furthermore, a channel layer is formed to be thick, whereby a buried-channel transistor can be easily formed and on-current can be increased.

Note that in the semiconductor device described in this embodiment, elements included in the first circuit group 110 and the second circuit group 130 are not limited to transistors. For example, a diode 120 may be provided in the first circuit group 110 (see FIG. 2B).

The structure of the diode 120 is not limited to a particular structure as long as it includes the silicon carbide layer 114. As an example, the diode 120 may include a first electrode layer 121 provided over the substrate 100 with the insulating layer 112 interposed therebetween, the silicon carbide layer 114 provided over the first electrode layer 121, a second electrode layer 122 provided over the silicon carbide layer 114.

In this case, in the diode 120, the first electrode layer 121 can function as an electrode which has an ohmic contact with the silicon carbide layer 114 and the second electrode layer 122 can function as an electrode which forms a Schottky junction with the silicon carbide layer 114.

Figure 2B:
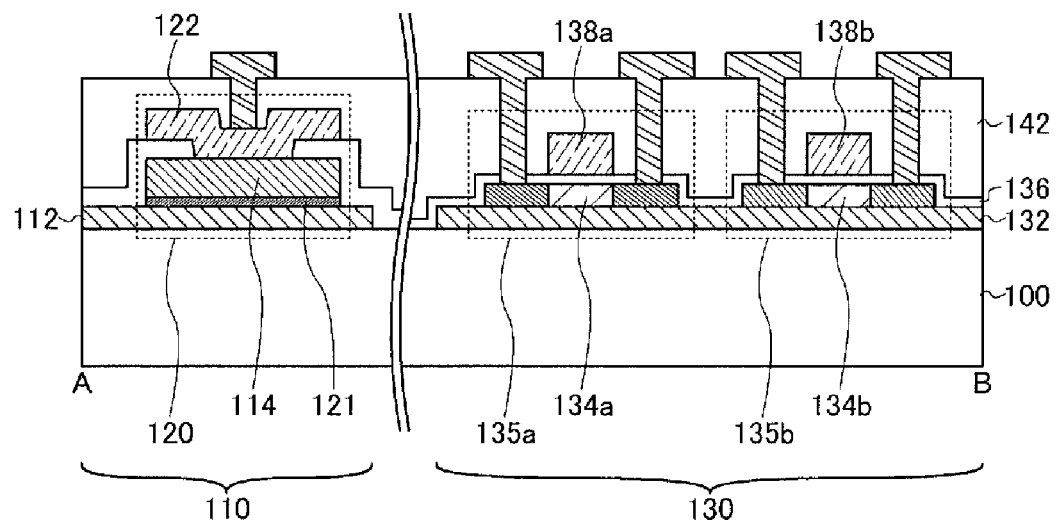

Note that in FIG. 2B, as the diode 120, a Schottky barrier diode in which a Schottky junction is utilized in a region where the silicon carbide layer 114 and the second electrode layer 122 are in contact with each other is used; however, the structure is not limited thereto. A PN junction diode may be used as the diode 120.

Thus, a diode (here, the diode 120) including a silicon carbide layer and a transistor (here, the transistors 135a and 135b) including a silicon layer as a channel layer are formed over the same substrate 100, whereby multifunctional circuits over the same substrate can be realized.

(Embodiment 2)

In this embodiment, an example of a method for manufacturing the semiconductor device described in Embodiment 1 is described with reference to drawings.

First, a method for manufacturing a substrate over which a plurality of semiconductor layers each having different band gap is formed over an insulating layer is described with reference to FIGS. 3A to 3E.

First, semiconductor substrates each having different band gap are prepared. Here, a silicon carbide substrate 210 and a silicon substrate 230 are prepared (see FIG. 3A).

As the silicon carbide substrate 210, a commercial single crystal silicon carbide substrate can be used. A typical example of the commercial single crystal silicon carbide substrate is a circular substrate with a diameter of 3 inches (75 mm). Note that the shape of the silicon carbide substrate 210 is not limited to a circle shape and a substrate processed into a rectangular shape or the like can also be used. Alternatively, a GaN substrate or the like may be used instead of the silicon carbide substrate 210. Further alternatively, a silicon substrate over which a silicon carbide layer is provided may be used. A silicon carbide layer over a silicon layer can be formed by carbonization treatment on the silicon substrate or by epitaxial growth of silicon carbide over the silicon substrate.

As the silicon substrate 230, a commercial single crystal silicon substrate can be used. A typical example of the commercial single crystal silicon substrate is a circular substrate which is 5 inches in diameter (125 mm), 6 inches in diameter (150 mm), 8 inches in diameter (200 mm), 12 inches in diameter (300 mm), or 16 inches in diameter (400 mm). Note that the shape of the silicon substrate 230 is not limited to a circular shape, and a substrate processed into a rectangular shape or the like can also be used.

Next, the insulating layer 112 is formed over the silicon carbide substrate 210, and at the same time, a brittle region 212 with a damaged crystal structure is formed at a predetermined depth from a surface of the silicon carbide substrate 210. Similarly, the insulating layer 132 is formed over the silicon substrate 230, and at the same time, a brittle region 232 with a damaged crystal structure is formed at a predetermined depth from a surface of the silicon substrate 230 (see FIG. 3B).

As the insulating layers 112 and 132, a single layer of an insulating layer such as a silicon oxide film, a silicon oxynitride film, a silicon nitride film, or a silicon nitride oxide film, or a stacked layer thereof can be formed. These films can be formed using a thermal oxidation method, a CVD method, a sputtering method, or the like.

When the insulating layers 112 and 132 are formed using a CVD method, a silicon oxide film formed using an organosilane such as tetraethoxysilane (abbreviation: TEOS, chemical formula: $Si(OC_2H_5)_4$) can be used; therefore, the surfaces of the insulating layers 112 and 132 can be flattened.

When the insulating layers 112 and 132 are formed using thermal oxidation treatment, the thermal oxidation treatment can be performed in an oxidizing atmosphere to which halogen (fluorine, chlorine, or the like) is added.

Further, the same material can be used for the insulating layers 112 and 132. For example, as the insulating layers 112 and 132, a silicon oxide film formed using a thermal oxidation method can be used. In this case, the base substrate can be bonded to the silicon carbide substrate 210 and the silicon substrate 230, under the similar condition, with the insulating layer 112 and the insulating layer 132 interposed therebetween, respectively.

The brittle region 212 can be formed by adding ions to the silicon carbide substrate 210. For example, the silicon carbide substrate 210 is irradiated with hydrogen ions having kinetic energy using an ion implantation method or an ion doping method, and thus hydrogen ions and defects due to hydrogen ions are introduced to a region of the silicon carbide substrate 210 at the predetermined depth and the brittle region 212 can be formed. Further, the brittle region 232 can be formed in a similar manner.

By controlling the depth of the region to which ions are added, the thickness of a silicon carbide layer to be separated and the thickness of a silicon layer to be separated can be controlled. Alternatively, ions may be added while the silicon carbide substrate 210 and the silicon substrate 230 are being heated.

As hydrogen ions which are added to the silicon carbide substrate 210 and the silicon substrate 230, one or plural kinds of ions selected from $H^+$, $H_2^+$, and $H_3^+$ can be used. Alternatively, ions which are added to the silicon carbide substrate 210 and the silicon substrate 230 are not limited to hydrogen ions and other kind of ions (such as helium ions) may be used.

Figure 3A:
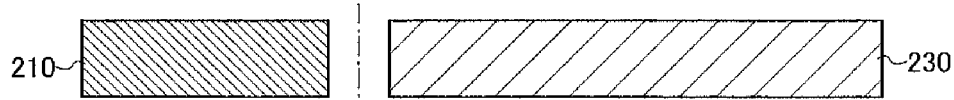
FIGS. 3A to 3E illustrate an example of a method for manufacturing a semiconductor device.
Figure 3B:
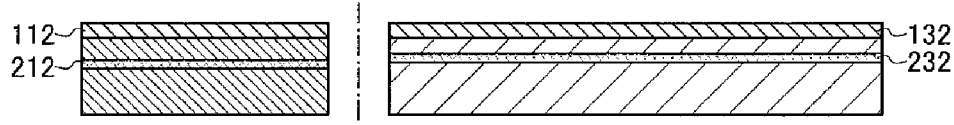
Figure 3C:
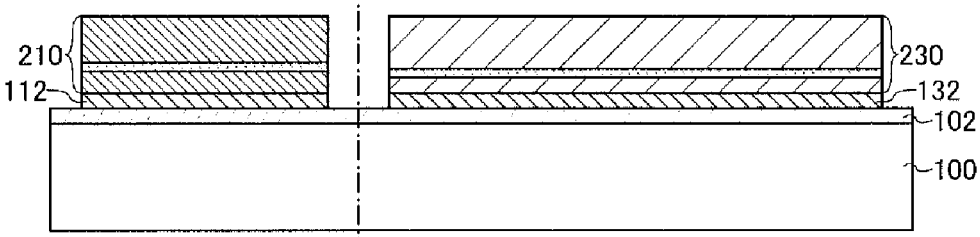

In FIG. 3B, the brittle region 212 and the brittle region 232 may be formed before the insulating layer 112 and the insulating layer 132 are formed. Alternatively, the brittle region 212 and the brittle region 232 may be formed after the insulating layer 112 and the insulating layer 132 are formed. However, it is preferable to form the brittle region 212 and the brittle region 232 after the insulating layer 112 and the insulating layer 132 are formed in terms of reducing damages due to addition of ions on surfaces of the silicon carbide substrate 210 and the silicon substrate 230.

Next, the base substrate 100 is prepared. Then, the silicon carbide substrate 210 is bonded to the base substrate 100 with the insulating layer 112 interposed therebetween and the silicon substrate 230 is bonded to the base substrate 100 with the insulating layer 132 interposed therebetween (see FIG. 3C).

As the base substrate 100, a substrate which is formed of an insulator, such as a glass substrate, a ceramic substrate, a quartz substrate, or a sapphire substrate; a substrate which is formed of a semiconductor such as silicon, a substrate which is formed of a conductor such as metal or stainless steel, or the like can be used. Further, a plastic substrate may be used as the base substrate 100 as long as it can endure a process temperature during the manufacturing process in this embodiment.

An insulating layer may be formed over a surface of the base substrate 100. As a material of the insulating layer, an insulating material containing silicon or germanium as its composition, such as silicon oxide, silicon oxynitride, silicon nitride, silicon nitride oxide, germanium oxide, germanium nitride, germanium oxynitride, or germanium nitride oxide can be used. In addition, metal oxide such as aluminum oxide, tantalum oxide, or hafnium oxide; metal nitride such as aluminum nitride; metal oxynitride such as aluminum oxynitride; or metal nitride oxide such as aluminum nitride oxide can also be used.

Here, the case where an insulating layer 102 is formed over a surface of the base substrate 100 is described. Accordingly, the insulating layer 112 and the insulating layer 102 are in contact with each other in bonding the base substrate 100 and the silicon carbide substrate 210, and the insulating layer 132 and the insulating layer 102 are in contact with each other in bonding the base substrate 100 and the silicon substrate 230.

Figure 3D:
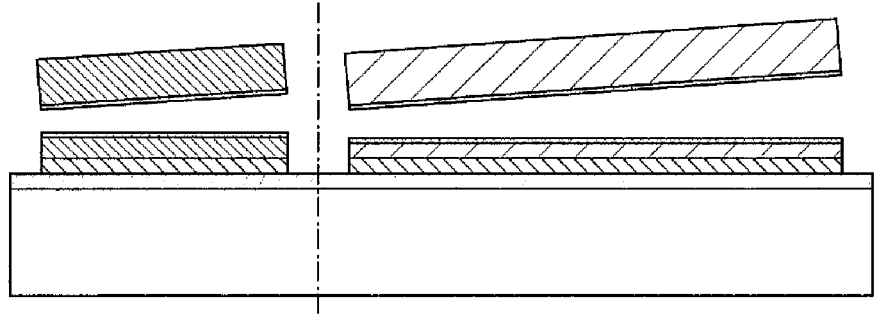

Next, the silicon carbide substrate 210 is separated in the brittle region 212, and at the same time, the silicon substrate 230 is separated in the brittle region 232 (see FIG. 3D).

Figure 3E:
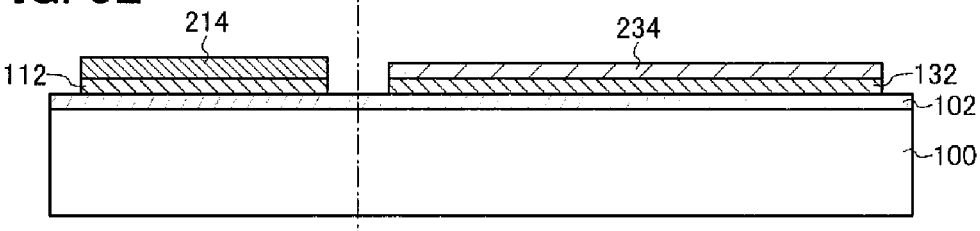

As a result, a substrate (a hybrid SOI substrate) can be obtained in which over the base substrate 100, a silicon carbide layer 214 is provided with the insulating layer 112 (and the insulating layer 102) interposed therebetween and a silicon layer 234 is provided with the insulating layer 132 (and the insulating layer 102) interposed therebetween (see FIG. 3E).

In FIG. 3D, heat treatment is preferably performed before separation of the silicon carbide substrate 210 and the silicon substrate 230. When the heat treatment is performed, volume change occurs in the microvoids formed in the brittle region 212 and the brittle region 232 because of temperature rise and a crack is generated in the brittle region 212 and the brittle region 232, whereby the silicon carbide substrate 210 and the silicon substrate 230 can be easily separated along the brittle region 212 and the brittle region 232, respectively.

The heat treatment can be performed using a diffusion furnace, a heating furnace such as a resistance heating furnace, a rapid thermal annealing (RTA) apparatus, a microwave heating apparatus, or the like. For example, the heat treatment can be performed using an RTA apparatus at a heating temperature of greater than or equal to 550° C. and less than or equal to 730° C. for a process time of greater than or equal to 0.5 minutes and less than or equal to 60 minutes. Here, the heat treatment may be performed at a temperature which does not exceed the strain point of the base substrate 100.

Next, an example of a method for manufacturing a semiconductor device using the substrate obtained through the steps illustrated in FIGS. 3A to 3E is described with reference to drawings.

Figure 4A:
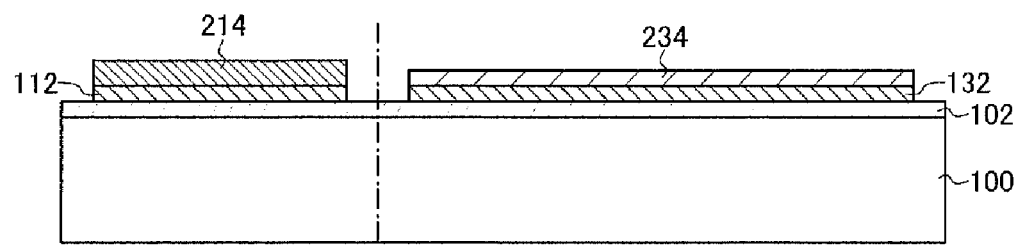
FIGS. 4A to 4D illustrate an example of a method for manufacturing the semiconductor device.

First, the substrate is prepared in which over the base substrate 100, the silicon carbide layer 214 is provided with the insulating layer 112 interposed therebetween and the silicon layer 234 is provided with the insulating layer 132 interposed therebetween (see FIG. 4A). Note that FIG. 4A corresponds to FIG. 3E.

Here, the case where the silicon carbide layer 214 is thicker than the silicon layer 234 is described; however, the structure is not limited thereto.

Figure 4B:
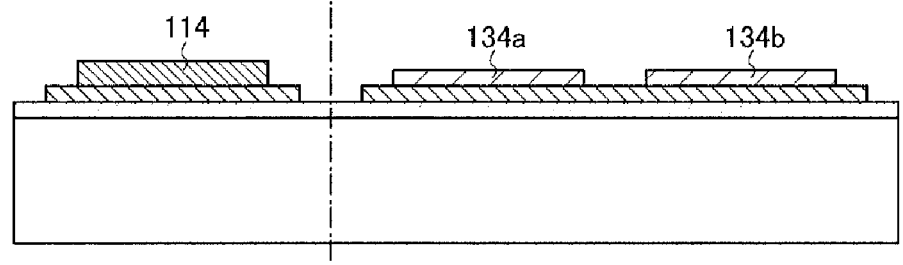

Next, the silicon carbide layer 214 is etched for element isolation, so that the island-shaped silicon carbide layer 114 is formed. Further, the silicon layer 234 is etched for element isolation, so that the island-shaped silicon layers 134a and 134b are formed (see FIG. 4B).

Before etching of the silicon carbide layer 214 and the silicon layer 234 is performed, a p-type impurity element such as boron, aluminum, or gallium, or an n-type impurity element such as phosphorus or arsenic may be added to one or both of the silicon carbide layer 214 and the silicon layer 234 in order to control the threshold voltage of TFTs. For example, a p-type impurity element such as boron, aluminum, or gallium is added to a region where an n-channel TFT is to be formed, and an n-type impurity element such as phosphorus or arsenic is added to a region where a p-channel TFT is to be formed.

Figure 4C:
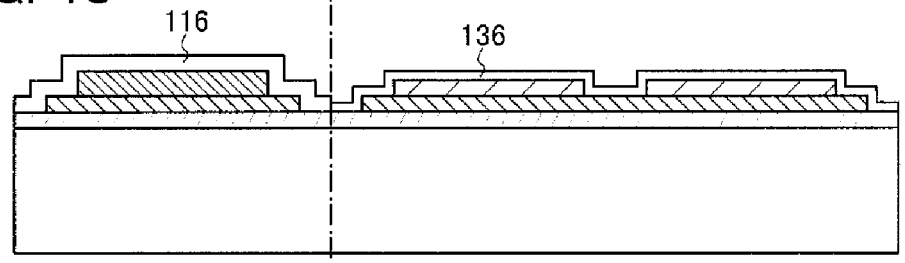

Next, the insulating layer 116 is formed over the silicon carbide layer 114 and the insulating layer 136 is formed over the silicon layers 134a and 134b (see FIG. 4C). The insulating layer 116 functions as a gate insulating layer of a transistor which includes the silicon carbide layer 114 as a channel layer, and the insulating layer 136 functions as a gate insulating layer of transistors each of which includes the silicon layer 134a or the silicon layer 134b as a channel layer.

The insulating layer 116 and the insulating layer 136 can be formed using a single layer of an insulating layer such as a silicon oxide film, a silicon oxynitride film, a silicon nitride film, a silicon nitride oxide film, a hafnium oxide film, an aluminum oxide film, or a tantalum oxide film, or a stacked layer thereof. These films can be formed using a CVD method, a sputtering method, or the like.

Alternatively, the insulating layer 116 and the insulating layer 136 may be formed in such a manner that surfaces of the silicon carbide layer 114 and the silicon layers 134a and 134b are oxidized or nitrided using plasma treatment.

Plasma treatment is performed using a mixed gas of a rare gas such as helium, argon, krypton, or xenon and a gas such as oxygen, nitrogen oxide, ammonia, nitrogen, or hydrogen, for example. In this case, when plasma is excited by introduction of microwaves, plasma with a low electron temperature and high density can be generated. When the surfaces of the silicon carbide layer 114 and the silicon layers 134a and 134b are oxidized or nitrided by oxygen radicals (OH radicals may be included) or nitrogen radicals (NH radicals may be included) which are generated using such high-density plasma, an insulating layer having a thickness of greater than or equal to 1 nm and less than or equal to 20 nm, desirably a thickness of greater than or equal to 2 nm and less than or equal to 10 nm, can be formed.

Because oxidation or nitridation of the silicon carbide layer 114 and the silicon layers 134a and 134b by the above-described plasma treatment is a solid-phase reaction, the interface state density between the insulating layer 116 and the silicon carbide layer 114 and the interface state density between the insulating layer 136 and the silicon layers 134a and 134b can be drastically reduced. Further, the silicon carbide layer 114 and the silicon layers 134a and 134b are directly oxidized or nitrided through plasma treatment, so that variation in thickness of the insulating layer to be formed can be suppressed.

Alternatively, the insulating layer 116 and the insulating layer 136 may be formed in such a manner that thermal oxidation is performed on the silicon carbide layer 114 and the silicon layers 134a and 134b. In the case of using thermal oxidation, a substrate having high heat resistance is preferably used as the base substrate 100.

In this embodiment, the case where the insulating layer 116 formed over the silicon carbide layer 114 is thicker than the insulating layer 136 formed over the silicon layers 134a and 134b is described. However, it is needless to say that the insulating layer 116 and the insulating layer 136 may be provided using the same material.

Figure 4D:
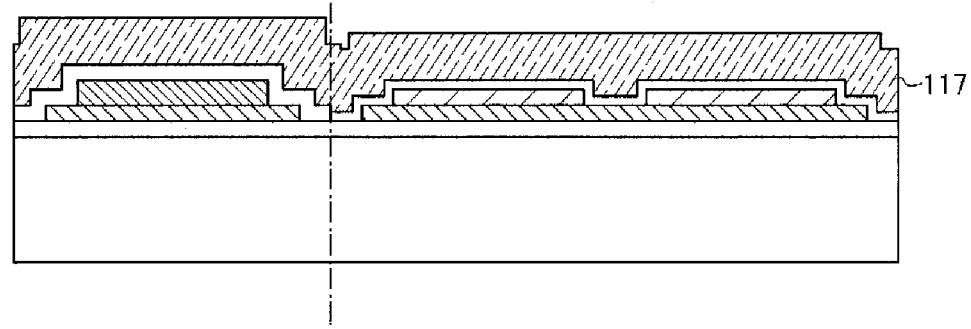

Next, a conductive layer 117 is formed over the insulating layer 116 and the insulating layer 136 (see FIG. 4D).

The conductive layer 117 can be formed using a single layer of a material such as tantalum (Ta), tungsten (W), titanium (Ti), molybdenum (Mo), aluminum (Al), copper (Cu), chromium (Cr), or niobium (Nb) or a stacked layer thereof. Alternatively, an alloy material containing the above-described metal as a main component or a compound containing the above-described metal can be used. Further alternatively, a semiconductor material such as polycrystalline silicon, in which a semiconductor is doped with an impurity element imparting a conductivity, or the like may be used. These materials can be formed using a CVD method, a sputtering method, or the like.

Figure 5A:
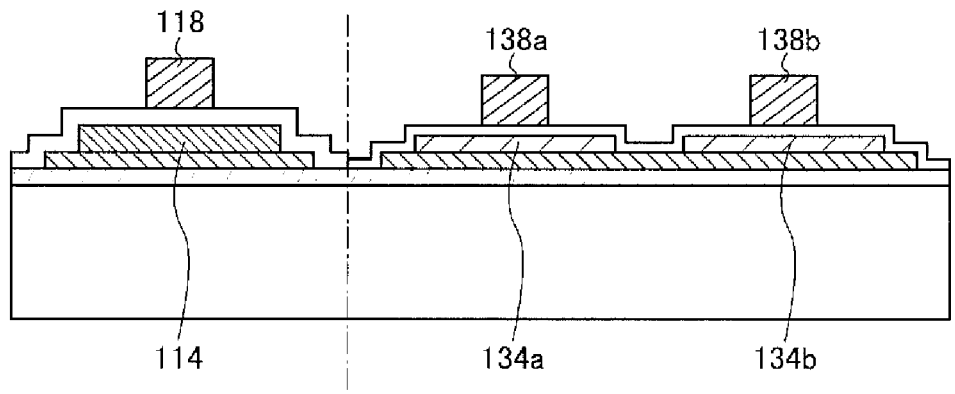
FIGS. 5A to 5C illustrate an example of a method for manufacturing the semiconductor device.

Next, the conductive layer 117 is etched, so that the conductive layer 118, the conductive layer 138a, and the conductive layer 138b are formed (see FIG. 5A).

The conductive layer 118 functions as a gate electrode of the transistor which includes the silicon carbide layer 114 as a channel layer. The conductive layer 138a functions as a gate electrode of the transistor which includes the silicon layer 134a as a channel layer, and the conductive layer 138b functions as a gate electrode of the transistor which includes the silicon layer 134b as a channel layer.

Figure 5B:
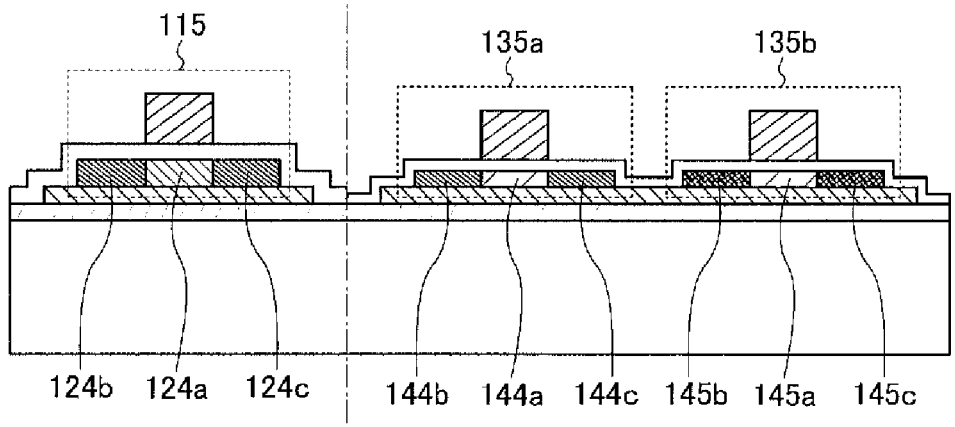

Next, impurity elements are added to the silicon carbide layer 114 and the silicon layers 134a and 134b, so that impurity regions 124b and 124c are formed in the silicon carbide layer 114, impurity regions 144b and 144c are formed in the silicon layer 134a, and impurity regions 145b and 145c are formed in the silicon layer 134b (see FIG. 5B).

The impurity regions 124b and 124c function as a source region and a drain region of the transistor 115 and a channel formation region 124a is formed between the impurity region 124b and the impurity region 124c. The impurity regions 144b and 144c function as a source region and a drain region of the transistor 135a and a channel formation region 144a is formed between the impurity region 144b and the impurity region 144c. The impurity regions 145b and 145c function as a source region and a drain region of the transistor 135b and a channel formation region 145a is formed between the impurity region 145b and the impurity region 145c.

As the impurity element, an impurity element imparting p-type conductivity, such as boron, aluminum, or gallium, or an impurity element imparting n-type conductivity, such as phosphorus or arsenic, may be added.

Here, as an example, an impurity element imparting n-type conductivity (such as phosphorus) is added to the silicon carbide layer 114 and the silicon layer 134a, and an impurity element imparting p-type conductivity (such as boron) is added to the silicon layer 134b.

Note that heat treatment for activation of the impurity regions (and recovery of crystallinity) is preferably performed after the impurity elements are added.

In general, since an impurity in a crystal of silicon carbide has the low diffusion coefficient, heat treatment at higher temperature (1500° C. or higher) is required in order to activate an impurity region formed in a silicon carbide layer, as compared to the case of activating an impurity region formed in a silicon layer. Therefore, in this embodiment, a laser beam is preferably used for activation of the impurity regions 124b and 124c provided in the silicon carbide layer 114. As the specific kinds of laser, KrF excimer laser (wavelength of 248 nm), ArF excimer laser (wavelength of 193 nm), or the like can be used.

For example, the silicon carbide layer 114 is irradiated with a laser beam after heat treatment at 300° C. to 700° C. In this case, the impurity regions (here, the impurity regions 144b and 144c and the impurity regions 145b and 145c) formed in the silicon layers 134a and 134b can be activated using heat treatment, and the impurity regions (here, the impurity regions 124b and 124c) formed in the silicon carbide layer 114 can be activated through irradiation with a laser beam. Further, after the silicon carbide layer 114 is irradiated with a laser beam, heat treatment at 300° C. to 700° C. may be performed; thus, it is effective to perform heat treatment while irradiation of a laser beam is performed since absorptance of a laser beam can be increased.

As described above, even when transistors are formed using a silicon carbide layer and a silicon layer provided over the same substrate, heat treatment and irradiation of a laser beam are performed in combination, whereby activation of an impurity region in the silicon layer and an impurity region in the silicon carbide layer can be performed sufficiently.

Further, activation of the impurity region in the silicon layer and the impurity region in the silicon carbide layer is performed using a combination of heat treatment and irradiation of a laser beam, whereby heat treatment for activation can be performed at a low temperature. As a result, a substrate having low heat resistance can be used as the base substrate 100. Further, irradiation of a laser beam is performed on not the entire surface but a selective region of the silicon carbide layer 114, whereby throughput can be improved.

When a substrate having a light-transmitting property, such as glass or plastic, is used as the base substrate 100, irradiation of a laser beam is performed from a back surface side (a surface opposite to the surface over which the transistors are formed) of the base substrate 100, so that the silicon carbide layer 114 can be activated.

When a substrate having heat resistance (such as a silicon substrate, a quartz substrate, or a metal substrate) is used as the base substrate 100, heat treatment for activation of the impurity regions may be performed at 400° C. to 1200° C. (for example, at 800° C.).

Further, a low-concentration impurity region which functions as a lightly doped drain (LDD) region may be provided in the transistors 115, 135a, and 135b illustrated in FIG. 5B. For example, regions including an impurity element at lower concentration than the impurity regions 124b and 124c may be provided between the channel formation region 124a and the impurity region 124b and between the channel formation region 124a and the impurity region 124c. Further, low-concentration impurity regions may be provided between the channel formation region 144a and the impurity region 144b and between the channel formation region 144a and the impurity region 144c. Furthermore, low-concentration regions may be provided between the channel formation region 145a and the impurity region 145b and between the channel formation region 145a and the impurity region 145c.

Figure 5C:
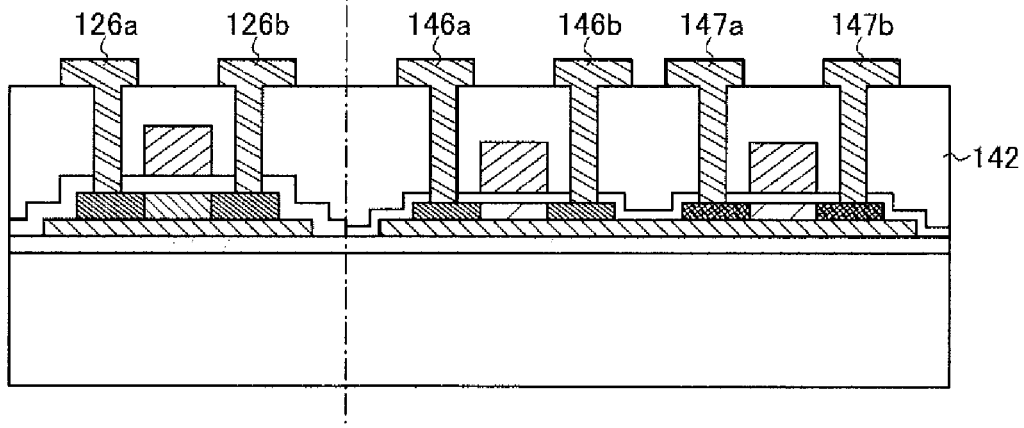

Next, an insulating layer 142 is formed so as to cover the transistors 115, 135a, and 135b, then over the insulating layer 142, conductive layers 126a and 126b functioning as a source electrode and a drain electrode of the transistor 115, conductive layers 146a and 146b functioning as a source electrode and a drain electrode of the transistor 135a, and conductive layers 147a and 147b functioning as a source electrode and a drain electrode of the transistor 135b are formed (see FIG. 5C).

The insulating layer 142 can be formed using an inorganic insulating material such as silicon oxide or silicon oxynitride or an organic insulating material such as polyimide or acrylic. The insulating layer 142 may have a single layer structure or a stacked layer structure in which a plurality of insulating layers is stacked.

The conductive layers 126a and 1266, the conductive layers 146a and 146b, and the conductive layers 147a and 147b can be formed through a sputtering method, a vacuum evaporation method, or the like, using a single-layer structure or a layered structure of a metal including an element selected from aluminum (Al), copper (Cu), titanium (Ti), tantalum (Ta), tungsten (W), molybdenum (Mo), chromium (Cr), neodymium (Nd), and scandium (Sc), an alloy including any of the above elements, nitride including any of the above elements, or the like.

Through the manufacturing process described in this embodiment, a semiconductor device can be manufactured in which a transistor including a silicon carbide layer as a channel layer and a transistor including a silicon layer as a channel layer are formed over the same substrate.

As described in this embodiment, a silicon carbide substrate and a silicon substrate are bonded to the same substrate and separated with part of them left, whereby an integrated circuit including an element having a silicon carbide layer and an element having a silicon layer over the same substrate can be formed. In this manner, even when an integrated circuit is formed using a silicon carbide substrate, part of a silicon carbide substrate is separated to form a silicon carbide layer over another substrate, so that an integrated circuit can be highly integrated and increased in size regardless of the size of the silicon carbide substrate.

Further, part of the silicon substrate is separated to form the silicon layer over the substrate over which the silicon carbide layer is formed by separation of part of the silicon carbide substrate, and the element is formed using the substrate including the silicon carbide layer and the silicon layer, so that the integrated circuit can have multiple functions and high integration and increase in size are achieved.

Further, the silicon carbide substrate and the silicon substrate are bonded to the same substrate and separated with part of them left to form the silicon carbide layer and the silicon layer over the same substrate, whereby the transistor including the silicon carbide layer and the transistor including the silicon layer can be manufactured through the same process, which can simplify the manufacturing process.

Further, in the transistor including the silicon carbide layer and the transistor including the silicon layer, conductive layers functioning as gate electrodes, conductive layers functioning as source electrodes and drain electrodes, insulating layers functioning as interlayer insulating layers, and the like are provided in the same process, whereby cost reduction can be achieved and the manufacturing process is simplified.

In this embodiment, elements such as transistors are formed after the silicon carbide layer 214 and the silicon layer 234 are formed over the base substrate 100 in such a manner that the silicon carbide substrate 210 and the silicon substrate 230 are bonded to the base substrate 100 and separated from the base substrate 100; however, this embodiment is not limited thereto.

For example, after only the silicon carbide layer 214 is formed over the base substrate 100 and an element is formed using the silicon carbide layer 214, the silicon substrate 230 may be bonded to the base substrate 100. Alternatively, after only the silicon layer 234 is formed over the base substrate 100 and an element is formed using the silicon layer 234, the silicon carbide substrate 210 may be bonded to the base substrate 100. That is, bonding of the silicon carbide substrate 210 to the base substrate 100 is not necessarily performed at the same time as bonding of the silicon substrate 230. Further, the silicon carbide layer 214 and the silicon layer 234 are not necessarily formed over the same surface.

In this embodiment, the case where one silicon carbide substrate and one silicon substrate are bonded to the base substrate 100 is described; however, this embodiment is not limited thereto. For example, a plurality of silicon carbide substrates may be bonded to the base substrate 100.
(Embodiment 3)

In this embodiment, another example of a method for manufacturing the semiconductor device described in Embodiment 1 is described with reference to drawings. In particular, an example of a method for manufacturing the semiconductor device illustrated in FIG. 2B is described.

Note that a manufacturing process (a material and the like which can be used) described in this embodiment has a lot in common with the manufacturing process described in Embodiment 2. Therefore, in the following description, repeated description of the same portions is omitted, and different portions are described in detail.

A method for manufacturing a substrate including a plurality of semiconductor layers each having a different band gap over an insulating layer is described with reference to FIGS. 6A to 6E.

First, semiconductor substrates each having a different band gap are prepared. Here, the silicon carbide substrate 210 and the silicon substrate 230 are prepared, and a conductive layer 221 is formed over the silicon carbide substrate 210 (see FIG. 6A). As the silicon carbide substrate 210, a P-type substrate or an N-type substrate can be used.

The conductive layer 221 can be formed using a single layer or a stacked layer of a metal including an element selected from nickel (Ni), titanium (Ti), molybdenum (Mo), aluminum (Al), and platinum (Pt) or an alloy material including any of the above elements.

In the case where the silicon carbide substrate 210 is brought into ohmic contact with the conductive layer formed using the above material, heat treatment (at 900° C. to 1000° C., for example) is preferably performed after formation of the conductive layer 221. Alternatively, an impurity element may be added to a surface of the silicon carbide substrate 210 in advance.

Next, the brittle region 212 with a damaged crystal structure is formed at a predetermined depth from the surface of the silicon carbide substrate 210 while the insulating layer 112 is formed over the conductive layer 221. Similarly, the brittle region 232 with a damaged crystal structure is formed at a predetermined depth from a surface of the silicon substrate 230 while the insulating layer 132 is formed over the silicon substrate 230 (see FIG. 6B).

Figure 6A:
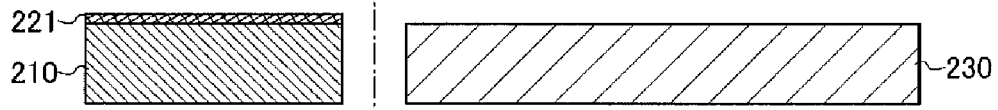
FIGS. 6A to 6E illustrate an example of a method for manufacturing a semiconductor device.
Figure 6B:
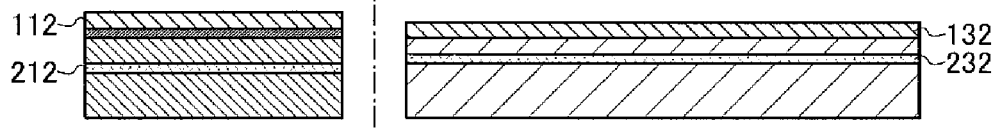
Figure 6C:
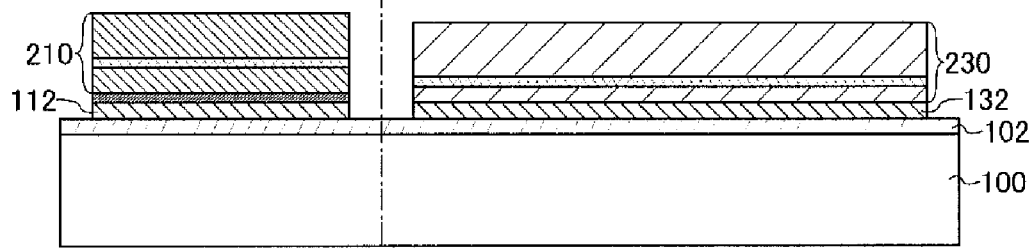

Then, the base substrate 100 is prepared, the silicon carbide substrate 210 is bonded to the base substrate 100 with the insulating layer 112 interposed therebetween, and the silicon substrate 230 is bonded to the base substrate 100 with the insulating layer 132 interposed therebetween (see FIG. 6C).

Here, the base substrate 100 over which the insulating layer 102 is formed is used. Accordingly, the insulating layer 112 and the insulating layer 102 are in contact with each other in bonding the base substrate 100 and the silicon carbide substrate 210 to each other, and the insulating layer 132 and the insulating layer 102 are in contact with each other in bonding the base substrate 100 and the silicon substrate 230 to each other.

Figure 6D:
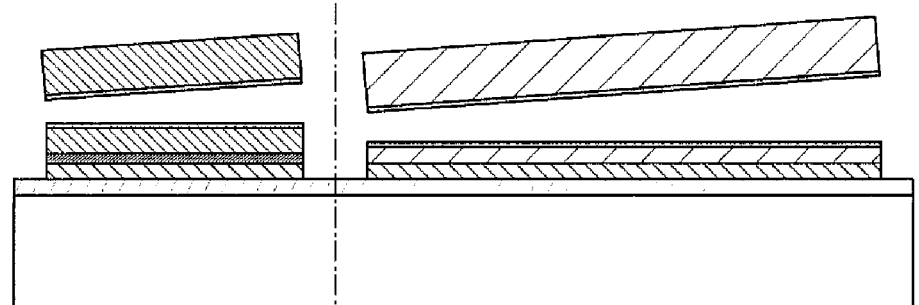

Next, the silicon carbide substrate 210 is separated in the brittle region 212 and the silicon substrate 230 is separated in the brittle region 232 (see FIG. 6D).

Figure 6E:
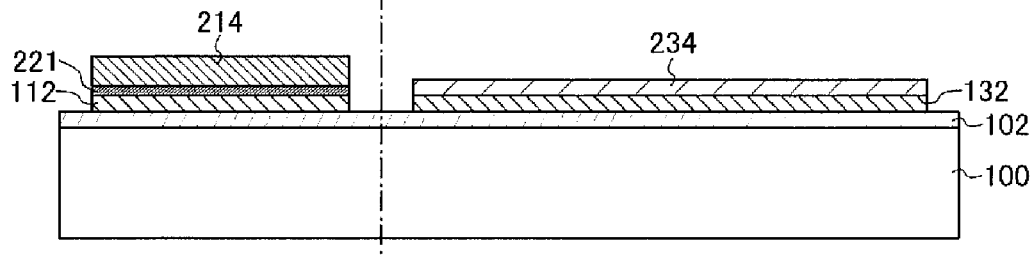

As a result, a substrate (a hybrid SOI substrate) can be obtained in which over the base substrate 100, the silicon carbide layer 214 is provided with the insulating layer 112 (and the insulating layer 102) and the conductive layer 221 interposed therebetween and the silicon layer 234 is provided with the insulating layer 132 (and the insulating layer 102) interposed therebetween (see FIG. 6E).

Next, an example of a method for manufacturing a semiconductor device formed using the substrate obtained through the steps illustrated in FIGS. 6A to 6E is described with reference to drawings.

Figure 7A:
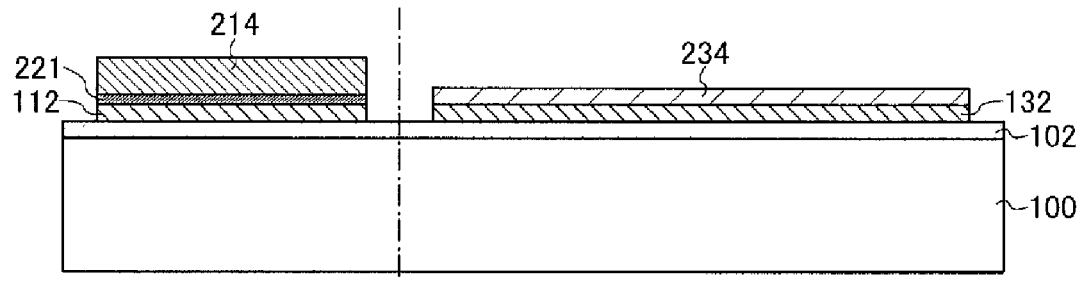
FIGS. 7A to 7D illustrate an example of a method for manufacturing the semiconductor device.

First, the substrate is prepared in which over the base substrate 100, the silicon carbide layer 214 is provided with the insulating layer 112 interposed therebetween and the silicon layer 234 is provided with the insulating layer 132 interposed therebetween (see FIG. 7A). Note that FIG. 7A corresponds to FIG. 6E.

In this embodiment, the case where the silicon carbide layer 214 is thicker than the silicon layer 234 is described; however, this embodiment is not limited thereto.

Figure 7B:
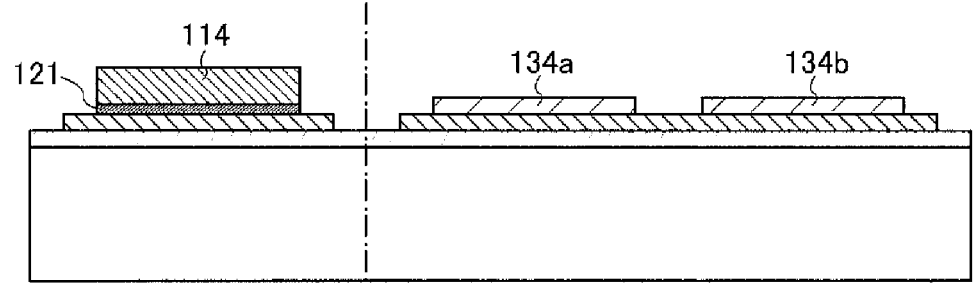

Next, the silicon carbide layer 214 is etched for element isolation, so that the island-shaped silicon carbide layer 114 is formed. Further, the silicon layer 234 is etched for element isolation, so that the island-shaped silicon layers 134a and 134b are formed. In addition, the conductive layer 221 is etched, so that the first electrode layer 121 is formed (see FIG. 7B). The first electrode layer 121 functions as an electrode of a diode including the silicon carbide layer 114.

Before the silicon carbide layer 214 and the silicon layer 234 are etched, a p-type impurity element such as boron, aluminum, or gallium, or an n-type impurity element such as phosphorus or arsenic may be added to the silicon layer 234 in order to control the threshold voltage of TFTs. For example, a p-type impurity element such as boron, aluminum, or gallium is added to a region where an n-channel TFT is to be formed, and an n-type impurity element such as phosphorus or arsenic is added to a region where a p-channel TFT is to be formed. Further, an impurity element may be added to the silicon carbide layer 214.

Figure 7C:
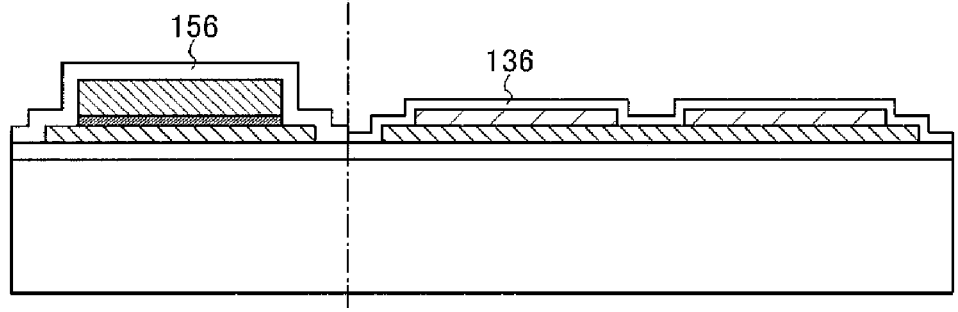

Next, an insulating layer 156 is formed over the silicon carbide layer 114 and the insulating layer 136 is formed over the silicon layers 134a and 134b (see FIG. 7C).

The insulating layer 156 can be formed using a single layer of an insulating film such as a silicon oxide film, a silicon oxynitride film, a silicon nitride film, a silicon nitride oxide film, a hafnium oxide film, an aluminum oxide film, or a tantalum oxide film, or a stacked layer thereof. These films can be formed using a CVD method, a sputtering method, or the like.

Alternatively, the insulating layer 156 may be formed in such a manner that a surface of the silicon carbide layer 114 is oxidized or nitrided using plasma treatment, and then, an insulating layer is formed over the oxide film or the nitride film using a CVD method, a sputtering method, or the like.

Alternatively, the insulating layer 156 may be formed in such a manner that thermal oxidation is performed on the silicon carbide layer 114. In the case of performing thermal oxidation, a substrate having high heat resistance is preferably used as the base substrate 100.

Figure 7D:
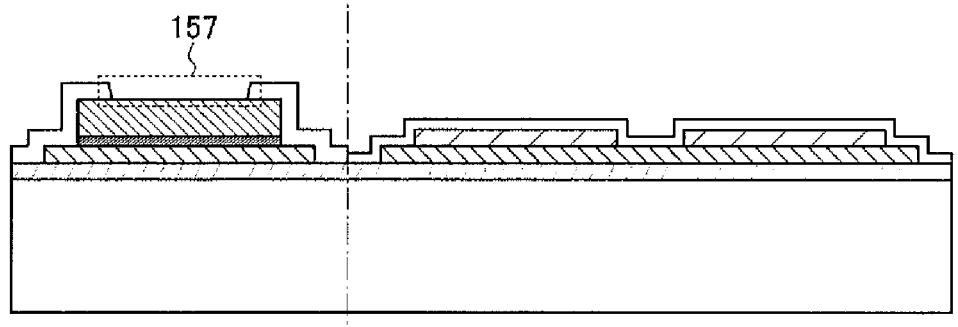

Next, the insulating layer 156 is etched, so that an opening portion 157 which exposes the silicon carbide layer 114 is formed (see FIG. 7D).

Figure 8A:
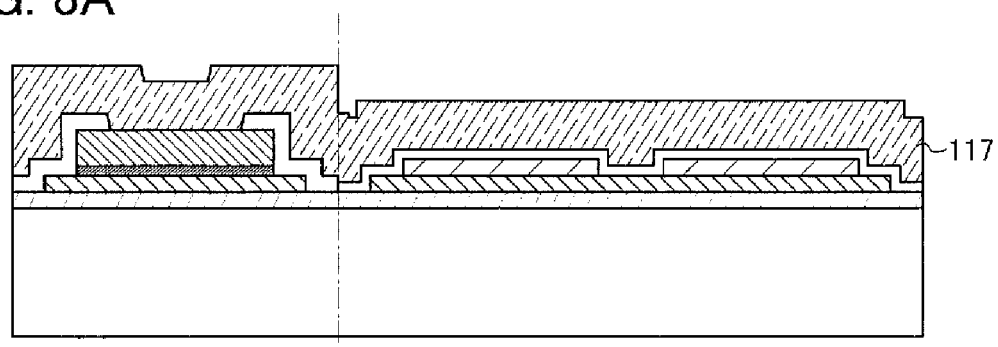
FIGS. 8A to 8C illustrate an example of a method for manufacturing the semiconductor device.

Next, the conductive layer 117 is formed over the insulating layer 156 and the insulating layer 136 (see FIG. 8A). The conductive layer 117 is formed in contact with the silicon carbide layer 114 through the opening portion 157.

Figure 8B:
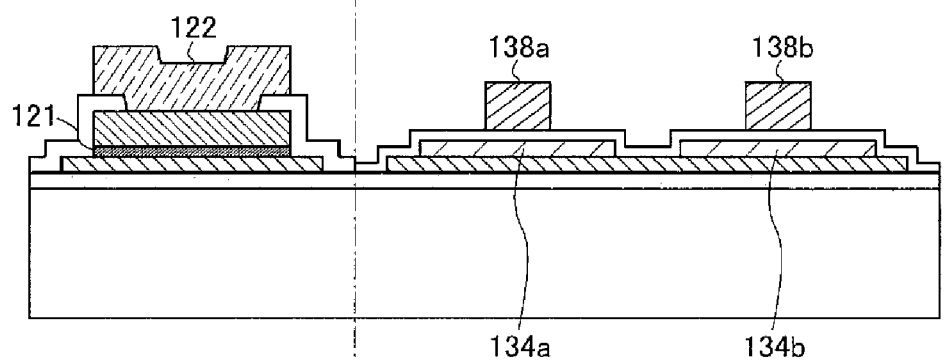

Next, the conductive layer 117 is etched, so that the second electrode layer 122, the conductive layer 138a, and the conductive layer 138b are formed (see FIG. 8B). The first electrode layer 121 functions as the electrode of the diode including the silicon carbide layer 114. Further, a Schottky junction is formed at a contact surface between the silicon carbide layer 114 and the second electrode layer 122.

Here, the case where the second electrode layer 122, the conductive layer 138a, and the conductive layer 138b are formed using the conductive layer 117 is described; however, this embodiment is not limited thereto. The second electrode layer 122 may be formed using a material which is different from those of the conductive layers 138a and 138b. The second electrode layer 122 is preferably formed using a material with which a Schottky junction is easily formed at the contact surface with the silicon carbide layer 114. For example, the second electrode layer 122 is preferably formed using gold (Au), platinum (Pt), nickel (Ni), titanium (Ti), molybdenum (Mo), or aluminum (Al). Needless to say, the conductive layer 117 may be formed using any of these materials.

Figure 8C:
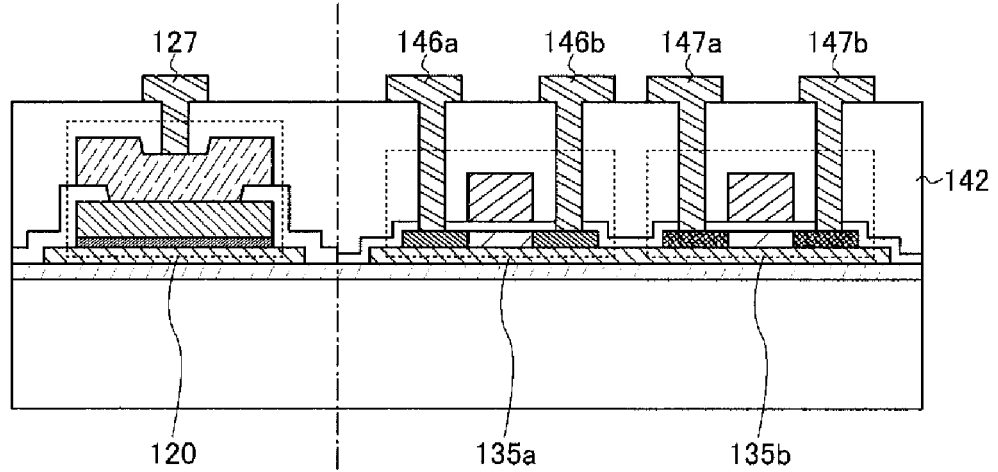

After that, impurity elements are added to the silicon layers 134a and 134b to form impurity regions. Accordingly, the conductive layers 146a and 146b functioning as the source electrode and the drain electrode of the transistor 135a are formed, and the conductive layers 147a and 147b functioning as the source electrode and the drain electrode of the transistor 135b are formed. Further, a conductive layer 127 which is connected to the second electrode layer 122 of the diode 120 may be formed at the same time as formation of the conductive layers 146a and 146b and the conductive layers 147a and 147b (see FIG. 8C).

The conductive layer 127 functions as a wiring. Further, when the diode 120 is electrically connected to the transistor 135a and/or the transistor 135b, the conductive layer 127 may be used.

Note that doping for imparting n-type conductivity to the silicon carbide may be performed on the vicinity of the contact surface of silicon carbide which makes an ohmic contact. As a dopant, nitrogen (N) or phosphorus (P) can be used. The dopant can be added using ion implantation, ion doping, or thermal diffusion. Timing of adding the dopant may be before or after formation of the brittle regions when an ohmic contact is made with the conductive layer 221; alternatively, the timing of adding the dopant may be between separation of silicon carbide and formation of the electrode layer 122 or between separation of silicon carbide and formation of the conductive layer 127 when an ohmic contact is made with the electrode layer 122.

Through the manufacturing process described in this embodiment, a semiconductor device which includes a diode including a silicon carbide layer and a transistor including a silicon layer as a channel layer over the same substrate can be manufactured.

(Embodiment 4)

In this embodiment, a semiconductor device with a structure which is different from that described in Embodiment 1 and a manufacturing method of the semiconductor device are described with reference to drawings. In particular, the case where a PN junction diode is used as the diode illustrated in FIG. 2B is described. Note that a structure and a manufacturing process (a material and the like which can be used) described in this embodiment have a lot in common with those described in the above embodiments. Therefore, in the following description, repeated description of the same portions is omitted, and different portions are described in detail.

Figure 9A:
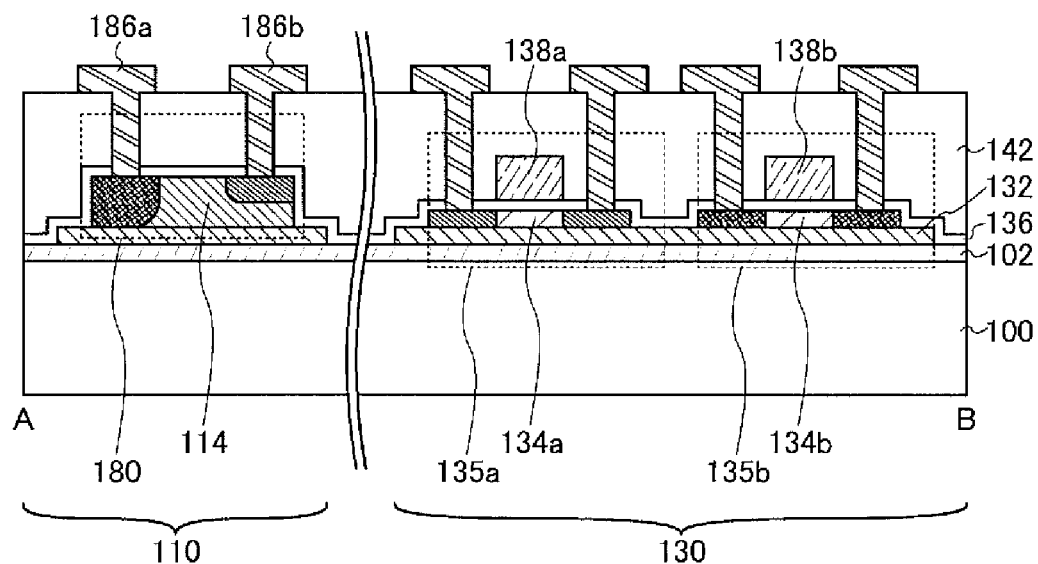
FIGS. 9A and 9B each illustrate an example of a structure of a semiconductor device.

In FIG. 9A, a diode 180 includes the silicon carbide layer 114 provided over the substrate 100 with the insulating layer 112 interposed therebetween and a first electrode layer 186*a* and a second electrode layer 186*b* which are electrically connected to the silicon carbide layer 114. An n-type impurity region and a p-type impurity region are formed in the silicon carbide layer 114, the first electrode layer 186*a* is electrically connected to one of the impurity regions, and the second electrode layer 186*b* is electrically connected to the other.

In addition, the diode 180 can be electrically connected to the transistor 135*a* and/or the transistor 135*b*.

Next, a method for manufacturing a semiconductor device illustrated in FIG. 9A is described with reference to drawings.

Figure 10A:
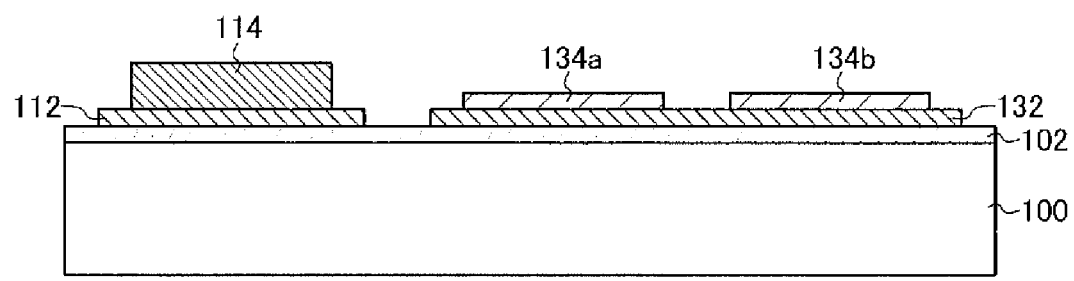
FIGS. 10A to 10D illustrate an example of a method for manufacturing a semiconductor device.

First, the substrate is prepared in which over the base substrate 100, the silicon carbide layer 214 is provided with the insulating layer 112 interposed therebetween and the silicon layer 234 is provided with the insulating layer 132 interposed therebetween. Then, the silicon carbide layer 214 is etched to form the island-shaped silicon carbide layer 114 while the silicon layer 234 is etched for element separation to form the island-shaped silicon layers 134*a* and 134*b* (see FIG. 10A).

Note that the manufacturing method illustrated in FIGS. 3A to 3E can be applied to a method for manufacturing the substrate in which over the base substrate 100, the silicon carbide layer 214 is provided with the insulating layer 112 interposed therebetween and the silicon layer 234 is provided with the insulating layer 132 interposed therebetween.

Note that, before the silicon carbide layer 214 and the silicon layer 234 are etched, a p-type impurity element such as boron, aluminum, or gallium or an n-type impurity element such as phosphorus or arsenic may be added to the silicon layer 234 in order to control the threshold voltage of TFTs. In addition, an impurity element may be added to the silicon carbide layer 214. In this embodiment, phosphorus is added to the silicon carbide layer, so that a low concentration n-type impurity region is formed. However, this embodiment is not limited thereto.

Figure 10B:
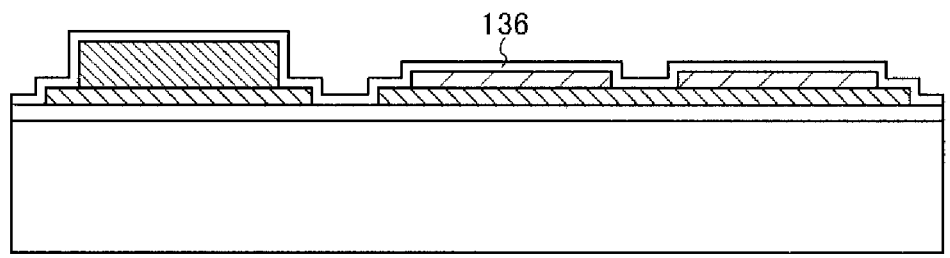

Next, the insulating layer 136 is formed over the silicon carbide layer 114 and the silicon layers 134*a* and 134*b* (see FIG. 10B).

Figure 10C:
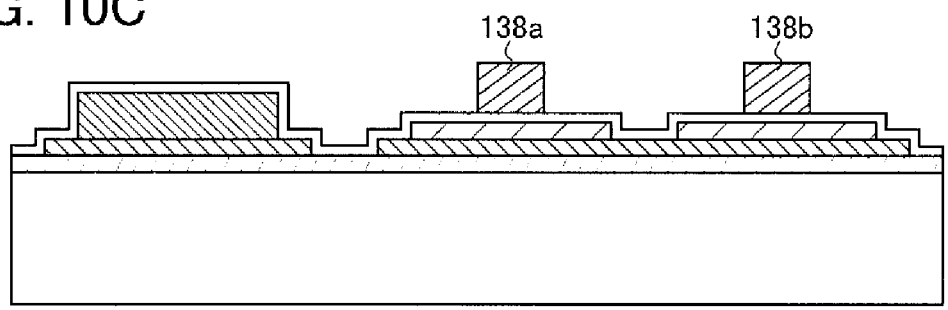

Next, the conductive layer 138*a* is formed above the silicon layer 134*a* and the conductive layer 138*b* is formed above the silicon layer 134*b* (see FIG. 10C).

Figure 10D:
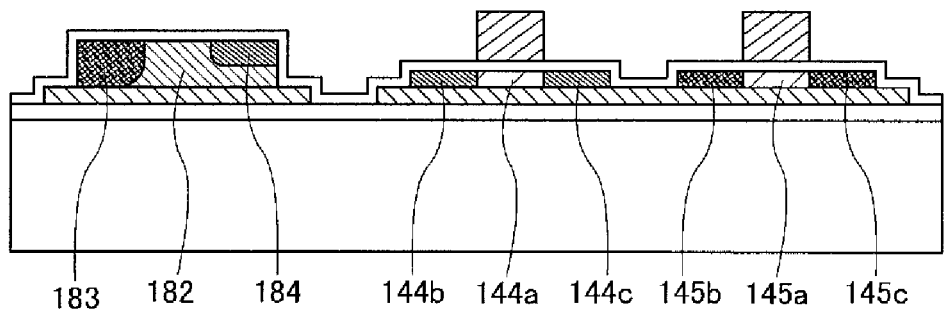

Next, impurity elements are added to the silicon carbide layer 114 and the silicon layers 134*a* and 134*b*, so that impurity regions are formed in the silicon carbide layer 114 and the silicon layers 134*a* and 134*b* (see FIG. 10D).

Here, a p-type impurity region 183 and an n-type impurity region 184 are formed in the silicon carbide layer 114, the n-type impurity regions 144*b* and 144*c* are formed in the silicon layer 134*a*, and the p-type impurity regions 145*b* and 145*c* are formed in the silicon layer 134*b*.

Further, in this embodiment, a low-concentration n-type impurity region 182, which has a lower impurity concentration than the n-type impurity region 184, is formed between the p-type impurity region 183 and the n-type impurity region 184 in the silicon carbide layer 114.

Further, the p-type impurity region 183 formed in the silicon carbide layer 114 and the p-type impurity regions 145*b* and 145*c* formed in the silicon layer 134*b* can be formed in the same step. Furthermore, the n-type impurity region 184 formed in the silicon carbide layer 114 and the n-type impurity regions 144*b* and 144*c* in the silicon layer 134*a* can be formed in the same step. In this case, the manufacturing process can be simplified.

Note that heat treatment for activation of impurity regions (and recovery of crystallinity) is preferably performed after the impurity elements are added to the silicon carbide layer 114 and the silicon layers 134*a* and 134*b*. Activation of the impurity regions can be performed in a manner similar to the method described in Embodiment 2.

Figure 11:
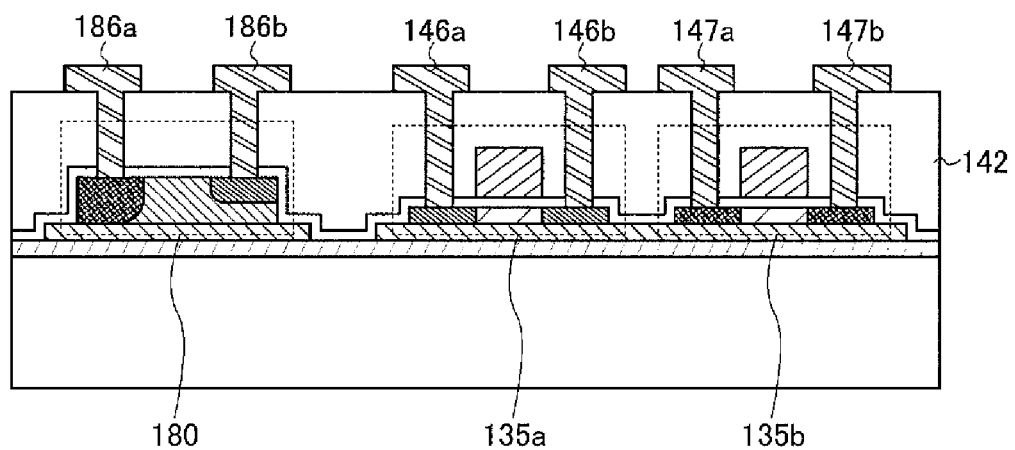
FIG. 11 illustrates an example of a method for manufacturing the semiconductor device.

Next, after the insulating layer 142 is formed so as to cover the insulating layer 136 and the conductive layers 138*a* and 138*b*, over the insulating layer 142, the first electrode layer 186*a* and the second electrode layer 186*b* which function as electrodes (an anode and a cathode) of the diode, the conductive layers 146*a* and 146*b* which function as the source electrode and the drain electrode of the transistor 135*a*, and the conductive layers 147*a* and 147*b* which function as the source electrode and the drain electrode of the transistor 135*b* are formed (see FIG. 11).

Here, the case is described where the first electrode layer 186*a* is electrically connected to the p-type impurity region 183 formed in the silicon carbide layer 114 and the second electrode layer 186*b* is electrically connected to the n-type impurity region 184 formed in the silicon carbide layer 114.

Through the manufacturing process described in this embodiment, a semiconductor device which includes a PN junction diode including a silicon carbide layer and a transistor including a silicon layer as a channel layer over the same substrate can be manufactured.

Figure 9B:
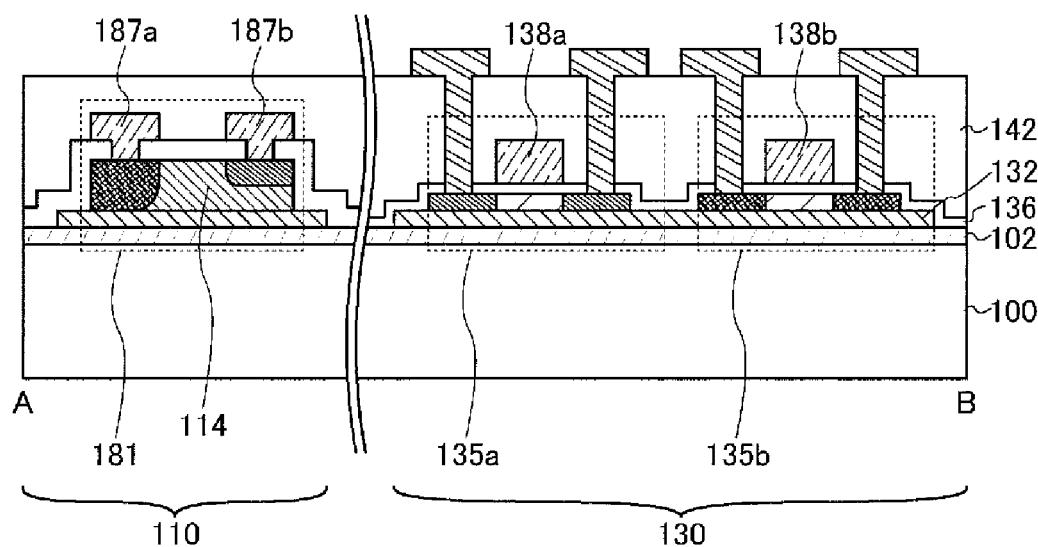

Note that the case where the first electrode layer 186*a* and the second electrode layer 186*b* of the diode 180 and the source electrodes and the drain electrodes of the transistors 135*a* and 135*b* are formed in the same step (using the same material) in the manufacturing process illustrated in the FIGS. 10A to 10D and FIG. 11 is described; however, this embodiment is not limited thereto. For example, as illustrated in FIG. 9B, a first electrode layer 187*a* and a second electrode layer 187*b* of a diode 181 may be formed in the same step (using the same material) as the conductive layer 138*a* functioning as a gate electrode of the transistor 135*a* and the conductive layer 138*b* functioning as a gate electrode of the transistor 135*b*.

(Embodiment 5)

In this embodiment, a semiconductor device with a structure which is different from those described in the above embodiments and a manufacturing method of the semiconductor device are described with reference to drawings. In particular, the case where a semiconductor substrate which has a larger band gap than a silicon substrate is bonded to the silicon substrate is described.

Note that a structure and a manufacturing process (a material and the like which can be used) described in this embodiment have a lot in common with those described in the above embodiments. Therefore, in the following description, repeated description of the same portions is omitted, and different portions are described in detail.

Figure 12A:
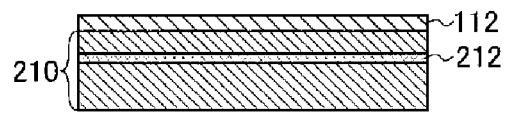
FIGS. 12A to 12E illustrate an example of a method for manufacturing a semiconductor device.

First, the silicon carbide substrate 210 is prepared which includes the brittle region 212 at a predetermined depth from a surface and which is provided with the insulating layer 112 over the surface (see FIG. 12A).

Figure 12B:
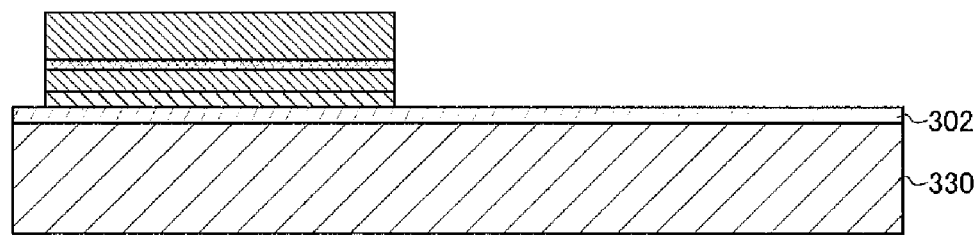

Next, a silicon substrate 330 is prepared and the silicon carbide substrate 210 is bonded to the silicon substrate 330 with the insulating layer 112 interposed therebetween (see FIG. 12B).

As the silicon substrate 330, a commercial single crystal silicon substrate can be used. A typical example of a commercial single crystal silicon substrate is a circular substrate which is 5 inches in diameter (125 mm), 6 inches in diameter (150 mm), 8 inches in diameter (200 mm), 12 inches in diameter (300 mm), or 16 inches in diameter (400 mm). Note that the shape of the silicon substrate 330 is not limited to a circular shape, and a substrate processed into a rectangular shape or the like can also be used.

Further, an insulating layer may be formed over a surface of the silicon substrate 330. Here, the case is described where an insulating layer 302 is formed over the silicon substrate 330 and a surface of the insulating layer 112 and a surface of the insulating layer 302 are bonded to each other.

As the insulating layer 302, a single layer of an insulating film such as a silicon oxide film, a silicon oxynitride film, a silicon nitride film, or a silicon nitride oxide film, or a stacked layer thereof can be formed. These films can be formed using a thermal oxidation method, a CVD method, a sputtering method, or the like.

Figure 12C:
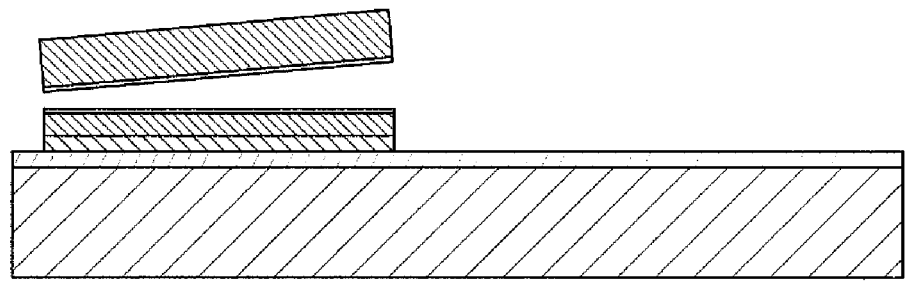

Next, the silicon carbide substrate 210 is separated in the brittle region 212 (see FIG. 12C).

Figure 12D:
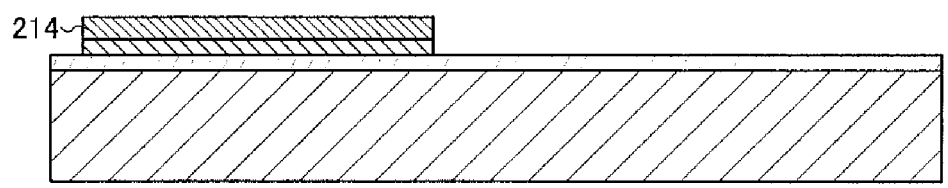

As a result, a substrate can be obtained in which the silicon carbide layer 214 is provided over part of the silicon substrate 330 with the insulating layer 302 and the insulating layer 112 interposed therebetween (see FIG. 12D).

Figure 12E:
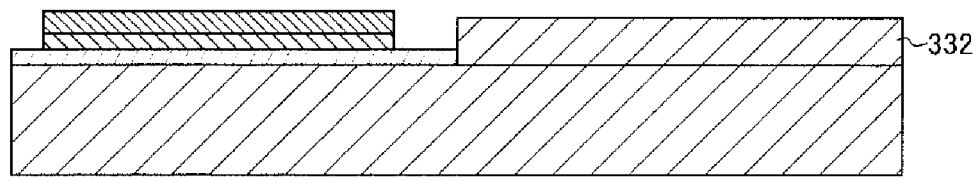

Note that a silicon layer 332 may be provided in a region over the silicon substrate 330, where the silicon carbide layer 214 is not provided (see FIG. 12E).

Part of the insulating layer 302 which is formed over the silicon substrate 330 is etched, and then the silicon layer 332 can be formed by epitaxial growth over the exposed silicon substrate 330.

Next, an example of a semiconductor device which is manufactured using the substrate obtained through the process illustrated in FIGS. 12A to 12E is described with reference to FIGS. 13A and 13B.

The first circuit group 110 formed using elements having high withstand voltage and the second circuit group 130 formed using elements which operate at high speed or at low voltage can be provided over the substrate obtained in FIG. 12D. For example, FIG. 13A illustrates the case where part of the first circuit group 110 formed using elements having high withstand voltage and part of the second circuit group 130 formed using elements which operate at high speed or at low voltage are provided over the substrate obtained in FIG. 12D.

The first circuit group 110 can be provided with the transistor 115 which includes the silicon carbide layer 114 as a channel layer.

The second circuit group 130 can be provided with the transistor 135 which includes the silicon substrate 330 as a channel layer. Here, after part of the insulating layer 302 provided over the silicon substrate 330 is etched, a conductive layer 138 is provided over the exposed silicon substrate with the insulating layer 136 interposed therebetween. The insulating layer 136 functions as a gate insulating layer of the transistor 135 and the conductive layer 138 functions as a gate electrode.

Figure 13A:
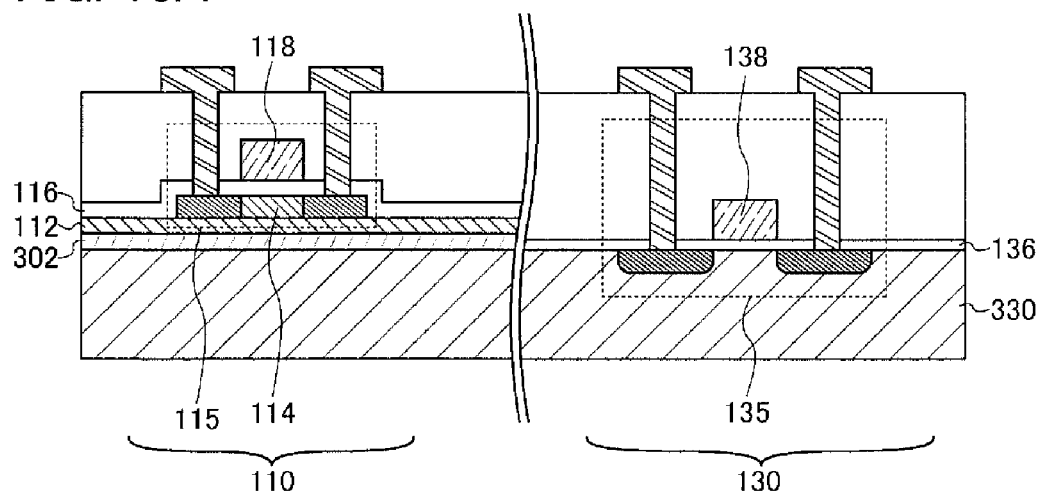
FIGS. 13A and 13B each illustrate an example of a structure of a semiconductor device.
Figure 13B:
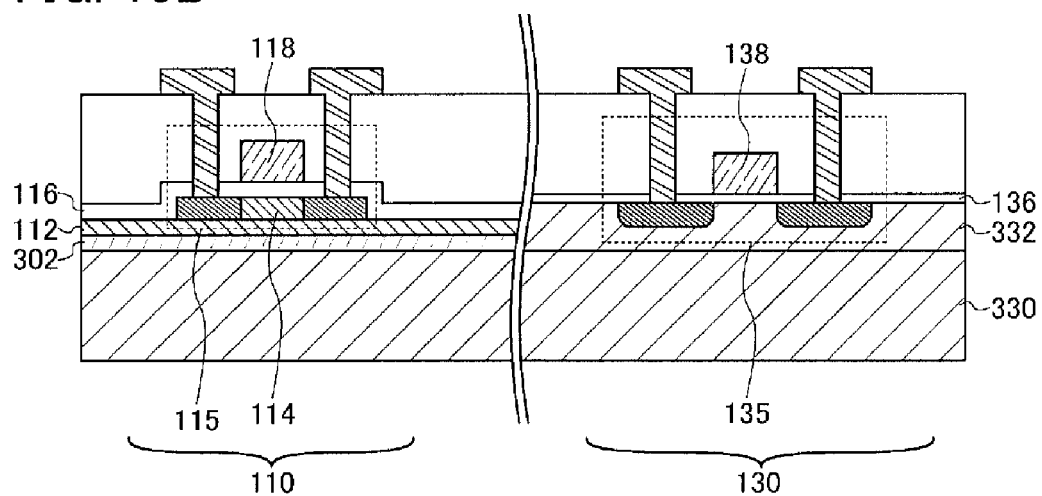

FIG. 13B illustrates the case where the first circuit group 110 formed using elements having high withstand voltage and the second circuit group 130 formed using elements which operate at high speed or at low voltage are provided over the substrate obtained in FIG. 12E.

The first circuit group 110 can be provided with the transistor 115 which include the silicon carbide layer 114 as a channel layer.

The second circuit group 130 can be provided with the transistor 135 which includes the silicon layer 332 provided over the silicon substrate 330 as a channel layer.

Note that in FIGS. 13A and 13B, the structures of the transistor 115 and the transistor 135 can have a variety of structures without being limited to a particular structure. Further, a diode formed using the silicon carbide layer 114 may be provided instead of the transistor 115.

This application is based on Japanese Patent Application serial no. 2009-078577 filed with Japan Patent Office on Mar. 27, 2009, the entire contents of which are hereby incorporated by reference.

What is claimed is:

1. A method for manufacturing a semiconductor device, comprising the steps of:
   forming a first brittle region in a silicon carbide substrate by first ion irradiation of the silicon carbide substrate;
   forming a second brittle region in a single crystal silicon substrate by second ion irradiation of the single crystal silicon substrate;
   bonding the silicon carbide substrate and a base substrate to each other with a first insulating layer interposed therebetween;
   bonding the single crystal silicon substrate and the base substrate to each other with a second insulating layer interposed therebetween;
   separating the silicon carbide substrate in the first brittle region to form a silicon carbide layer over the base substrate with the first insulating layer interposed therebetween;
   separating the single crystal silicon substrate in the second brittle region to form a single crystal silicon layer over the base substrate with the second insulating layer interposed therebetween; and
   forming a first transistor including the silicon carbide layer as a channel layer and a second transistor including the single crystal silicon layer as a channel layer.

2. The method for manufacturing a semiconductor device, according to claim 1,
   wherein the step of forming the first transistor including the silicon carbide layer as a channel layer and a second transistor including the single crystal silicon layer as a channel layer comprises a step of activating an impurity region after an impurity element is added to the silicon carbide layer and the silicon layer to form the impurity region, and
   wherein the impurity region formed in the silicon carbide layer is activated using laser beam irradiation and the impurity region formed in the silicon layer is activated using heat treatment at 300 C. to 700 C.

3. The method for manufacturing a semiconductor device, according to claim 1, wherein a glass substrate is used as the base substrate.

4. The method for manufacturing a semiconductor device, according to claim 1, wherein the silicon carbide layer is thinner than the single crystal silicon layer.

5. A method for manufacturing a semiconductor device, comprising the steps of:
- forming a conductive layer over a silicon carbide substrate;
- forming a first brittle region in the silicon carbide substrate by irradiation of the silicon carbide substrate with a first ion;
- forming a second brittle region in a single crystal silicon substrate by irradiation of the single crystal silicon substrate with a second ion;
- bonding the silicon carbide substrate and a base substrate to each other with the conductive layer and a first insulating layer interposed therebetween;
- bonding the single crystal silicon substrate and the base substrate to each other with a second insulating layer interposed therebetween;
- separating the silicon carbide substrate in the first brittle region to form a silicon carbide layer over the base substrate with the conductive layer and the first insulating layer interposed therebetween;
- separating the single crystal silicon substrate in the second brittle region to form a single crystal silicon layer over the base substrate with the second insulating layer interposed therebetween; and
- forming a diode including the silicon carbide layer and a transistor including the single crystal silicon layer as a channel layer.

6. The method for manufacturing a semiconductor device, according to claim 5, wherein a glass substrate is used as the base substrate.

7. The method for manufacturing a semiconductor device, according to claim 5, wherein the silicon carbide layer is thinner than the single crystal silicon layer.

8. A method for manufacturing a semiconductor device, comprising the steps of:
- forming a first brittle region in a silicon carbide substrate by first ion irradiation of the silicon carbide substrate;
- forming a second brittle region in a single crystal silicon substrate by second ion irradiation of the single crystal silicon substrate;
- bonding the silicon carbide substrate and a base substrate to each other with a first insulating layer interposed therebetween;
- bonding the single crystal silicon substrate and the base substrate to each other with a second insulating layer interposed therebetween;
- separating the silicon carbide substrate in the first brittle region to form a silicon carbide layer over the base substrate with the first insulating layer interposed therebetween;
- separating the single crystal silicon substrate in the second brittle region to form a single crystal silicon layer over the base substrate with the second insulating layer interposed therebetween;
- forming a p-type impurity region in the silicon carbide layer and the single crystal silicon layer; and
- forming a n-type impurity region in the silicon carbide layer and the single crystal silicon layer.

9. The method for manufacturing a semiconductor device, according to claim 8, wherein a glass substrate is used as the base substrate.

10. The method for manufacturing a semiconductor device, according to claim 8, wherein the silicon carbide layer is thinner than the single crystal silicon layer.

* * * * *